(12) United States Patent
You

(10) Patent No.: US 7,972,964 B2
(45) Date of Patent: Jul. 5, 2011

(54) SEMICONDUCTOR DEVICE WITH CONTACT STRUCTURE AND MANUFACTURING METHOD THEREOF

(75) Inventor: Chun-Gi You, Yongin (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/448,513

(22) Filed: Jun. 7, 2006

(65) Prior Publication Data

US 2006/0226554 A1 Oct. 12, 2006

Related U.S. Application Data

(62) Division of application No. 10/341,193, filed on Jan. 13, 2003, now Pat. No. 7,317,208.

(30) Foreign Application Priority Data

Mar. 7, 2002 (KR) .............................. 2002/0012086
Nov. 1, 2002 (KR) ................................. 2002/67502

(51) Int. Cl.
 *H01L 21/311* (2006.01)
(52) U.S. Cl. . 438/700; 438/624; 438/638; 257/E21.026; 257/E21.038; 257/E21.259; 257/E21.492; 349/85
(58) Field of Classification Search .................. 438/153, 438/700, 701, 725, 787, 791, 623, 708, 709, 438/696, 702, 624, 638, 703, 639, 149, 233, 438/698, 637, 30, 42, 43, 155; 216/18, 19; 257/E21.026, E21.037, E21.038, E21.575, 257/E21.579, E21.577, E21.576, E21.578, 257/E33.06, E33.055, E33.065, E21.259, 257/E21.492; 349/84, 85, 86, 56
See application file for complete search history.

(56) References Cited

U.S. PATENT DOCUMENTS

| 5,621,556 | A | * | 4/1997 | Fulks et al. ....................... 349/42 |
| 5,629,237 | A | * | 5/1997 | Wang et al. ................... 438/701 |
| 6,060,379 | A |  | 5/2000 | Huang et al. |
| 6,133,074 | A | * | 10/2000 | Ishida et al. .................. 438/153 |
| 6,211,069 | B1 | * | 4/2001 | Hu et al. ......................... 438/637 |
| 6,215,154 | B1 | * | 4/2001 | Ishida et al. .................. 257/347 |
| 6,271,543 | B1 |  | 8/2001 | Ohtani et al. |
| 6,300,244 | B1 |  | 10/2001 | Itabashi et al. |

(Continued)

FOREIGN PATENT DOCUMENTS

CN 1290922 4/2001

(Continued)

*Primary Examiner* — Julio J Maldonado
(74) *Attorney, Agent, or Firm* — F. Chau & Associates, LLC

(57) ABSTRACT

A plurality of gate lines are formed on a substrate. After depositing a gate insulating layer, a semiconductor layer and a doped amorphous silicon layer are sequentially formed thereon. A lower insulating layer made of silicon nitride and an upper insulating layer made of a photosensitive organic material are deposited thereon after forming data lines and drain electrodes. The upper insulating layer is patterned to form an unevenness pattern on its surface and contact holes on the drain electrodes. The lower insulating layer is patterned together with the gate insulating layer using a photoresist pattern having apertures located in the contact holes to form other contact holes respectively exposing the drain electrodes, portions of the gate lines, and portions of the data lines. After forming transparent electrodes and contact assistants respectively connected to the drain electrodes and the gate and the data lines through the contact holes, reflecting electrodes having apertures are formed on the transparent electrodes.

22 Claims, 47 Drawing Sheets

U.S. PATENT DOCUMENTS

| | | |
|---|---|---|
| 6,352,921 B1 | 3/2002 | Han et al. |
| 6,372,558 B1 * | 4/2002 | Yamanaka et al. ............ 438/149 |
| 6,413,856 B1 * | 7/2002 | Lou ............................... 438/638 |
| 6,414,730 B1 * | 7/2002 | Akamatsu et al. ............... 349/43 |
| 6,577,374 B1 * | 6/2003 | Nakata et al. ................. 349/156 |
| 6,664,145 B1 * | 12/2003 | Yamazaki et al. ............ 438/149 |
| 2002/0090809 A1 * | 7/2002 | Tobimatsu et al. ............ 438/623 |
| 2005/0151892 A1 * | 7/2005 | Sakurai et al. ................... 349/40 |

FOREIGN PATENT DOCUMENTS

| | | | |
|---|---|---|---|
| JP | 60178660 | | 9/1985 |
| JP | 05173058 | | 7/1993 |
| JP | 06-273800 | * | 9/1994 |
| JP | 08-255875 | | 10/1996 |
| JP | 09129882 | | 5/1997 |
| JP | 11281992 | | 10/1999 |
| JP | 11312810 | | 11/1999 |
| JP | 2000003913 | | 1/2000 |
| JP | 2000122094 | | 4/2000 |
| JP | 2001007203 | | 1/2001 |
| JP | 2001-042355 | * | 2/2001 |
| JP | 2001032086 | | 2/2001 |
| KR | 1020000016865 | | 3/2000 |
| KR | 102000031459 | | 6/2000 |
| KR | 10200010046652 | | 6/2001 |
| KR | 1020010107088 | | 12/2001 |
| KR | 1020010111841 | | 12/2001 |

* cited by examiner

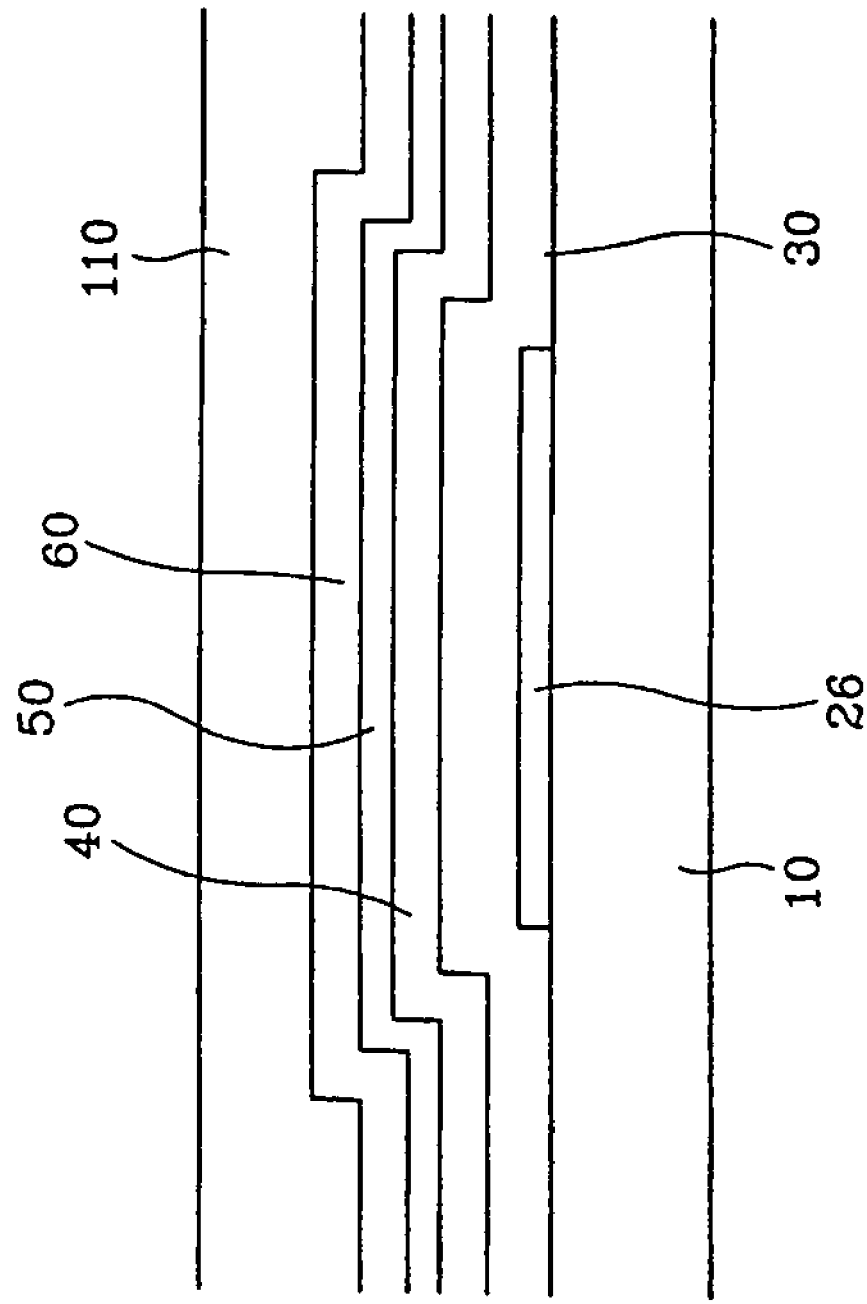

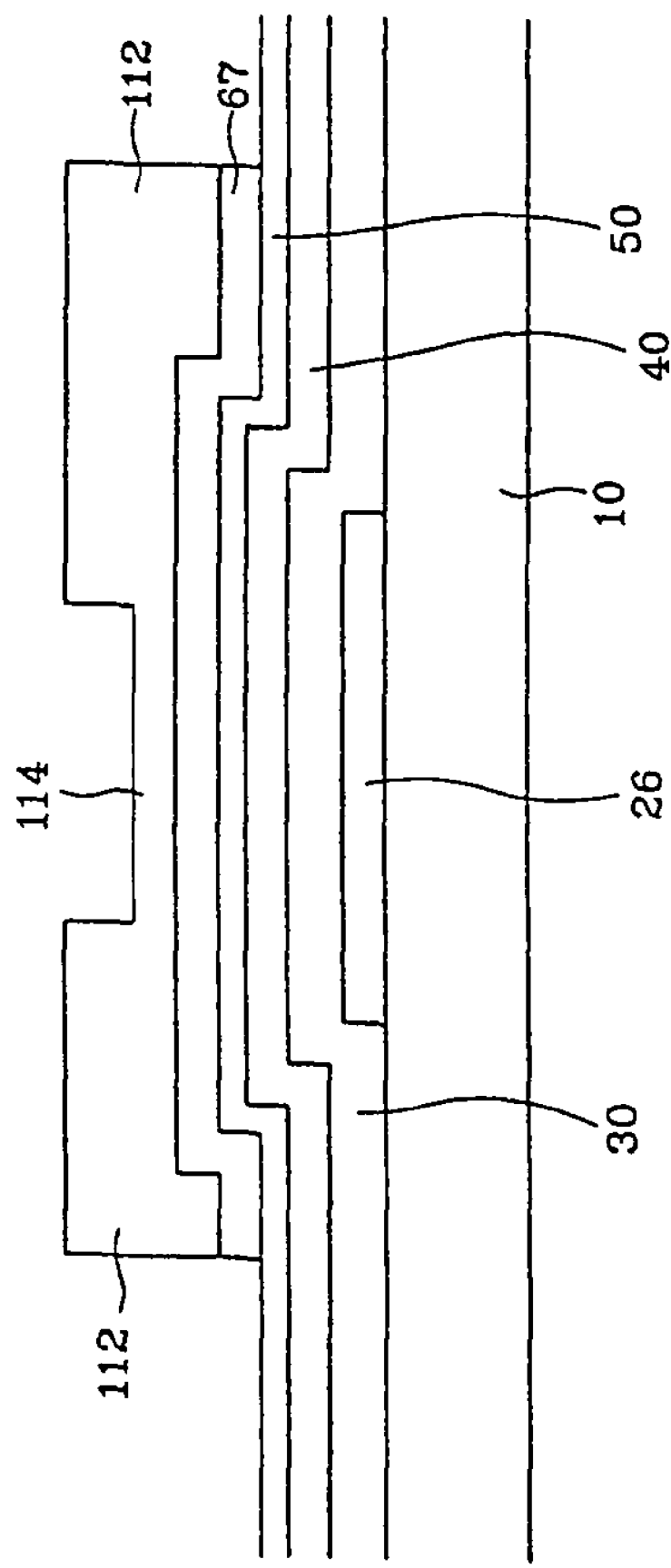

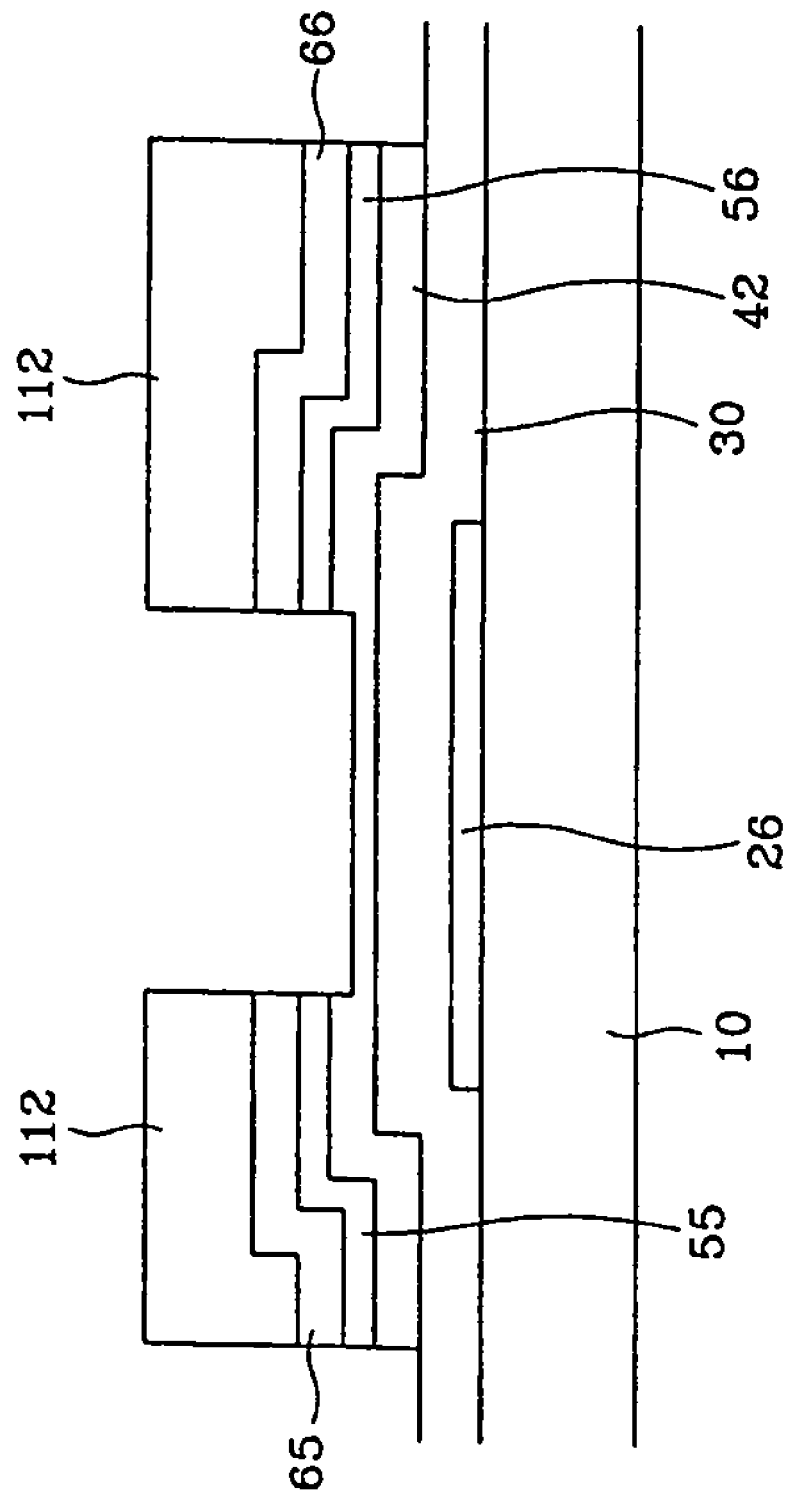

US 7,972,964 B2

SEMICONDUCTOR DEVICE WITH CONTACT STRUCTURE AND MANUFACTURING METHOD THEREOF

CROSS-REFERENCE TO RELATED APPLICATION

This application is a divisional of U.S. patent application Ser. No. 10/341,193 filed on Jan. 13, 2003 now U.S. Pat. No. 7,317,208, the disclosure of which is incorporated by reference herein.

BACKGROUND OF THE INVENTION

1. Field of the Invention

The present invention relates to a semiconductor device with a contact structure, and more particularly to a thin film transistor array panel including a contact structure and a manufacturing method thereof.

2. Discussion of Related Art

A typical semiconductor device has multiple layers of wires interposed between interlayer insulating layers. It is common that the interlayer insulating layers are made of materials with low permittivity to minimize the interference between signals flowing through the different wires, and different layers of wires transmitting the same signals are electrically connected to each other through contact holes provided at the interlayer insulating layers.

The interlayer insulating layers include an organic insulating layer with low permittivity, which is commonly formed by spin coating. When the structure underlying the organic layer has a steep height difference, the organic material is localized onto a specific area during the spin coating, thereby causing poor surface uniformity of the organic layer and the disconnection of a wire formed on the organic layer. In addition, for a liquid crystal display ("LCD"), particularly for a reflective type LCD displaying images by reflecting external light and for a transflective type LCD operating both in a reflective mode and a transmissive mode, this deteriorates display characteristics.

At present, an LCD is one of the most widely used flat panel displays. An LCD, which includes two panels having field-generating electrodes and a liquid crystal layer interposed therebetween, controls the transmittance of light passing through the liquid crystal layer by realigning liquid crystal molecules in the liquid crystal layer with voltages applied to the electrodes. Among these LCDs, the most commonly used one provides at least one field-generating electrode on each panel and includes thin film transistors ("TFTs") switching the voltages applied to the electrodes.

Generally, a panel with TFTs ("TFT array panel") includes, in addition to the TFTs, signal wires including gate lines transmitting scanning signals and data lines transmitting image signals, and pixel electrodes electrically connected to the gate lines and the data lines via the TFTs.

A pixel electrode of a reflective type LCD or a transflective type LCD includes a conductive reflecting film, which preferably has embossment for increasing the reflecting efficiency to improve display characteristics. The embossment of the reflecting film is formed by providing an organic insulating layer with unevenness under the reflecting film.

However, the stepped height of the organic insulating layer due to the steep height difference of the underlying structure gives the poor profile of the unevenness of the organic insulating layer, thereby causing the non-uniform embossment of the reflecting film to generate strains in a screen.

SUMMARY OF THE INVENTION

A semiconductor device having a thin film array panel and method of manufacturing thereof are provided. The method includes: forming a first conductor on a substrate; depositing a first insulating layer on the first conductor; forming a second insulating layer on the first insulating layer, the second insulating layer having a first contact hole opposite the first conductor; patterning the first insulating layer by using either a photoresist pattern or the second insulating layer as an etch mask to form a second contact hole exposing the first conductor together with the first contact hole; and forming a second conductor connected to the first conductor through the first and the second contact holes.

It is preferable that the second insulating layer preferably includes organic insulating material. In this case, the formation of the second insulating layer includes: spin-coating the second insulating layer; and patterning the second insulating layer to form the first contact hole.

In addition, the second insulating layer preferably includes photosensitive material, and thus the patterning of the second insulating layer includes: exposing the second insulating layer to light through a photomask; and developing the second insulating layer.

According to an embodiment of the present invention, a photomask includes a transparent area, an opaque area and a translucent area, and a sidewall of the first contact hole has a stepwise shape.

It is preferable that the first insulating layer comprises silicon nitride or silicon oxide.

When using the photoresist pattern, the photoresist pattern preferably has an opening smaller than the first contact hole.

According to an embodiment of the present invention, the method further includes enlarging the first contact hole after the patterning of the first insulating layer preferably by means of ashing of the first insulating layer. Alternatively, the method further includes narrowing the second contact hole after the patterning of the first insulating layer preferably by means of reflow of the first insulating layer. Preferably, the second conductor includes at least one of reflective material and transparent material.

According to an embodiment of the present invention, a semiconductor device is provided, which includes: a substrate; a first conductor formed on the substrate; a first insulating layer formed on the first conductor and having a first contact hole exposing at least a portion of the first conductor; a second insulating layer formed on the first insulating layer and having a second contact hole exposing the first conductor along with the first contact hole, a unity of the first and the second contact holes having a height-dependent width; and a second conductor formed on the second insulating layer and connected to the first conductor through the first and the second contact holes.

It is preferable that the width of the unity of the first and the second contact holes at a higher position of the unity is wider than at a lower position of the unity. Preferably, the unity of the first and the second contact holes has a stepwise sidewall, the second contact hole is larger than the first contact hole, and the first contact hole exposes a surface of the first insulating layer. The width of the exposed surface of the first insulating layer is preferably equal to or larger than 0.1 microns.

The sidewalls of the first and the second contact holes are tapered and have different inclination angles. The inclination angle of the sidewall of the first contact hole is preferably larger than the inclination angle of the sidewall of the second contact hole.

According to an embodiment of the present invention, a method of manufacturing a thin film transistor array panel for a liquid crystal display is provided, which includes: forming a gate line on an insulating substrate; depositing a gate insulating layer; forming a semiconductor layer; forming a data line intersecting the gate line and a drain electrode disconnected from the data line; depositing a first insulating layer; forming a second insulating layer having a first contact hole on the drain electrode; patterning the first insulating layer using a photoresist pattern or the second insulating layer to form a second contact hole exposing a portion of the drain electrode together with the first contact hole; and forming a pixel electrode electrically connected to the drain electrode through the first and the second contact holes.

The pixel electrode includes at least one of a reflecting electrode and a transparent electrode. When the pixel electrode has a reflecting electrode, it is preferably that a surface of the second insulating layer has an unevenness pattern. The data line, the drain electrode and the semiconductor layer are formed by a photolithography using a photoresist pattern with position-dependent thickness.

According to an embodiment of the present invention, a thin film transistor array panel for a liquid crystal display is provided, which includes: a gate line formed on a substrate; a gate insulating layer on the gate line; a semiconductor layer on the gate insulating layer; a data line formed at least in part on the semiconductor layer; a drain electrode formed at least in part on the semiconductor layer and spaced apart from the data line; a first insulating layer formed on the data line and the drain electrode and having a first contact hole exposing the drain electrode at least in part; a second insulating layer formed on the first insulating layer and having a second contact hole exposing the drain electrode together with the first contact hole, a unity of the first and the second contact holes having a height-dependent width; and a pixel electrode formed on the second insulating layer and connected to the drain electrode through the first and the second contact holes.

The pixel electrode comprises a reflecting electrode and a transparent electrode, and the reflecting electrode has an aperture. It is preferable that at least one of the gate insulating layer and the first insulating layer has a third contact hole exposing a portion of the gate line or a portion of the data line, and the thin film transistor array panel further includes a contact assistant including the same layer as the pixel electrode and electrically connected to either of the gate line or the data line.

BRIEF DESCRIPTION OF THE DRAWINGS

A more complete appreciation of the invention, and many of the attendant advantages thereof, will be readily apparent with reference to the following detailed description when considered in conjunction with the accompanying drawings in which like reference symbols indicate the same or the similar components, wherein:

FIGS. 18A and 18B are sectional views of the TFT array panel shown in FIG. 17A taken along the lines XVIIB-XVIIB' and XVIIC-XVIIC', respectively, and illustrate the step following the step shown in FIGS. 17B and 17C;

FIGS. 20A, 21A and 22A, and FIGS. 20B, 21B and 22B are respective sectional views of the TFT array panel shown in FIG. 19A taken along the lines XIXB-XIXB' and XIXC-XIXC', respectively, and illustrate steps following the step shown in FIGS. 19B and 19C;

DETAILED DESCRIPTION OF PREFERRED EMBODIMENTS

Figure 1A:
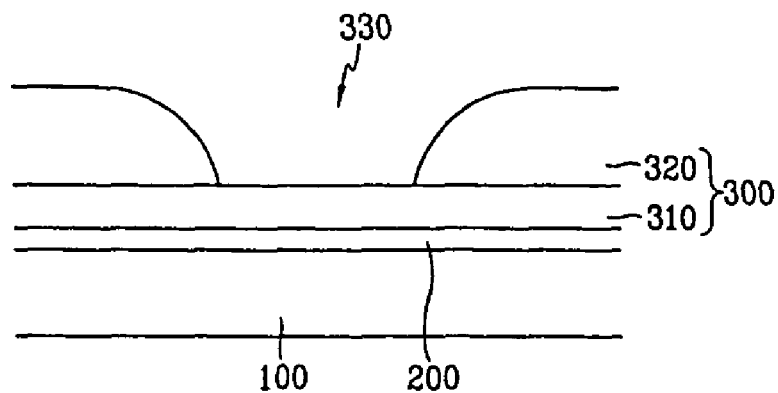
FIGS. 1A to 1C are sectional views of a contact structure of a semiconductor device sequentially illustrating a manufacturing method thereof according to an embodiment of the present invention.

Preferred embodiments of the present invention now will be described more fully hereinafter with reference to the accompanying drawings. The present invention may, however, be embodied in many different forms and should not be construed as limited to the embodiments set forth herein.

In the drawings, the thickness of layers and regions are exaggerated for clarity. Like numerals refer to like elements throughout this specification. It will be understood that when an element such as a layer, region or substrate is referred to as being "on" another element, it can be directly on the other element or intervening elements may also be present. In contrast, when an element is referred to as being "directly on" another element, there are no intervening elements present.

Now, contact structures of a semiconductor device, manufacturing methods thereof, TFT array panels including contact structures and manufacturing methods thereof according to embodiments of the present invention will be described with reference to the accompanying drawings.

Figure 1B:
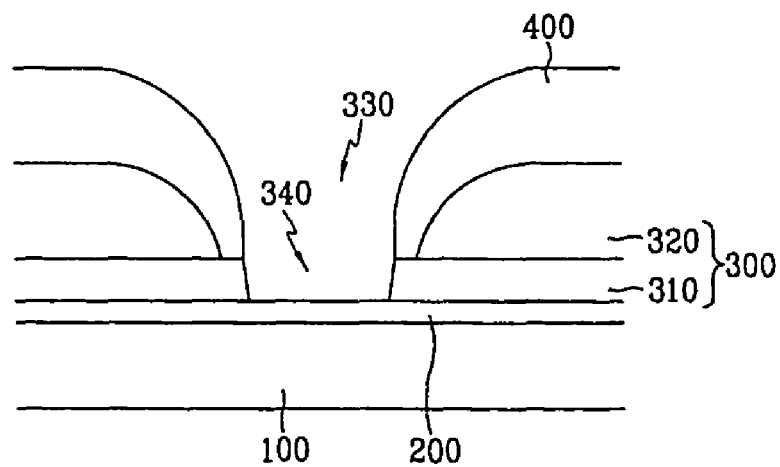
Figure 1C:
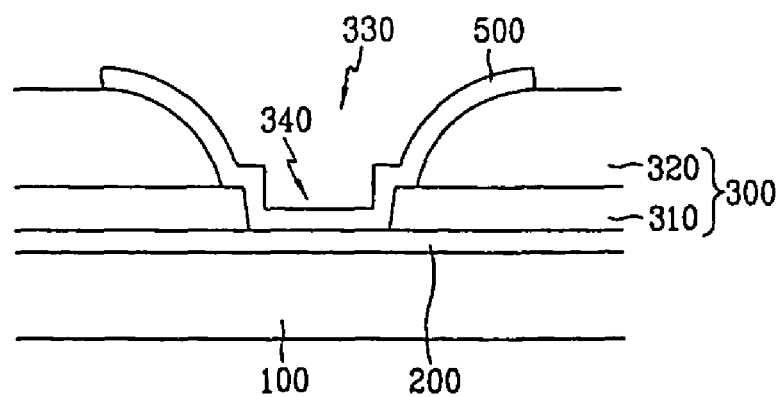

FIGS. 1A to 1C are sectional views of a contact structure of a semiconductor device sequentially illustrating the steps of a manufacturing method thereof according to an embodiment of the present invention.

First, a lower insulating layer 310 preferably made of inorganic material such as silicon nitride or silicon oxide is deposited on a substrate 100 provided with a lower wire 200 thereon as shown in FIG. 1A. An upper insulating layer 320 preferably made of organic insulating material with low permittivity is coated on the lower insulating layer 310 to form an interlayer insulator 300. Thereafter, the upper insulating layer 320 is patterned by photolithography to form an upper contact hole 330 exposing a portion of the lower insulating layer 310 on the lower wire 200.

Next, as shown in FIG. 1B, the exposed portion of the lower insulating layer 310 is patterned using a photoresist pattern having an aperture located inside the upper contact hole 330 as an etching mask to form a lower contact hole 340 exposing a portion of the lower wire 200. Since the lower contact hole 340 is smaller than the upper contact hole 330, the upper contact hole 330 exposes the top surface of the lower insulating layer 310, and thus the resultant contact structure includes a sidewall having a stepwise structure without undercut.

Finally, as shown in FIG. 1C, after removing the photoresist pattern, an upper wire 500 is formed on the upper insulating layer 320 by photo-etching using a photo mask such that the upper wire 500 is electrically connected to the lower wire 200 through the upper and the lower contact holes 330 and 340. The stepwise-shaped contact structure ensures the smooth profile of the lower wire 200 and prevents the disconnection of the upper wire 500.

According to this embodiment of the present invention, the lower and the upper insulating layers 310 and 320 defining the contact holes 340 and 330 has a tapered sidewall as shown in FIG. 1C. The inclination angles of the lower and the upper layers 310 and 320 are different, and the inclination angle of the upper insulating layer 320 is preferably smaller than that of the lower insulating layer 310. The inclination angles of the lower and the upper insulating layers 310 and 320 with respect to a horizontal surface are preferably 30-70 degrees.

The method of manufacturing a contact structure of a semiconductor device according to this embodiment of the present invention removes the stepped height of the upper layer 320 due to the depth of the contact hole 340 of the lower layer 310 by forming the upper insulating layer 320 before forming the lower contact hole 340 of the lower insulating layer 310.

A method of manufacturing a contact structure of a semiconductor device according to another embodiment of the present invention will be described with reference to FIGS. 1A, 1D and 1E.

Figure 1D:
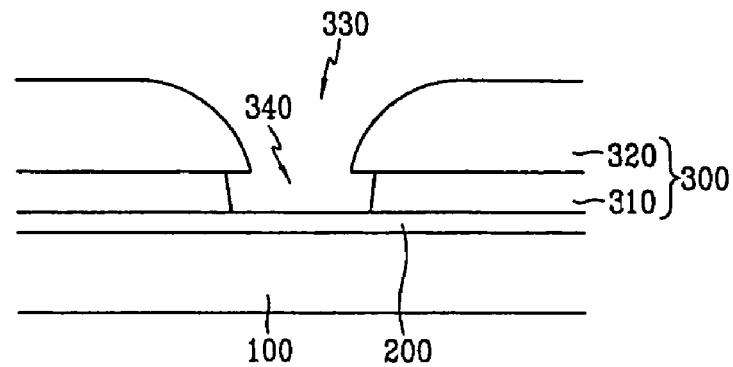
FIGS. 1D and 1E are sectional views of a contact structure of a semiconductor device sequentially illustrating a manufacturing method thereof according to another embodiment of the present invention.
Figure 1E:
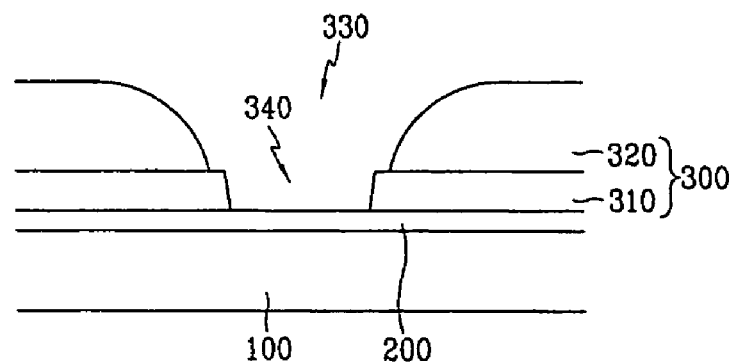

FIGS. 1D and 1E are sectional views of a contact structure of a semiconductor device sequentially illustrating the steps of a manufacturing method thereof according to another embodiment of the present invention.

In a method of manufacturing a contact structure of a semiconductor device according to another embodiment of the present invention, an interlayer insulator 300 is formed on a substrate 100 provided with a lower wire 200 thereon as shown in FIG. 1A. The interlayer insulator 300 includes a lower insulating layer 310 and an upper insulating layer 320 having an upper contact hole 330 exposing a portion of the lower insulating layer 310 opposite the lower wire 200. The upper insulating layer 320 is preferably made of photosensitive material.

As shown in FIG. 1D, the lower insulating layer 310 is etched using the upper insulating layer 320 as an etch mask to form a lower contact hole 340 exposing the lower wire 200.

As shown in FIG. 1E, the upper insulating layer 320 is subject to ashing such that the sidewall of the upper contact hole 330 is whittled to enlarge the upper contact hole 330. Hence, the upper contact hole 330 becomes larger than the lower contact hole 340 and the sidewall of the contact structure forms a stepwise shape.

Then, an upper wire 500 electrically connected to the lower wire 200 via the upper and the lower contact holes 330 and 340 is formed on the upper insulating layer 320.

A method of manufacturing a contact structure of a semiconductor device according to another embodiment of the present invention will be described with reference to FIG. 1F.

Figure 1F:
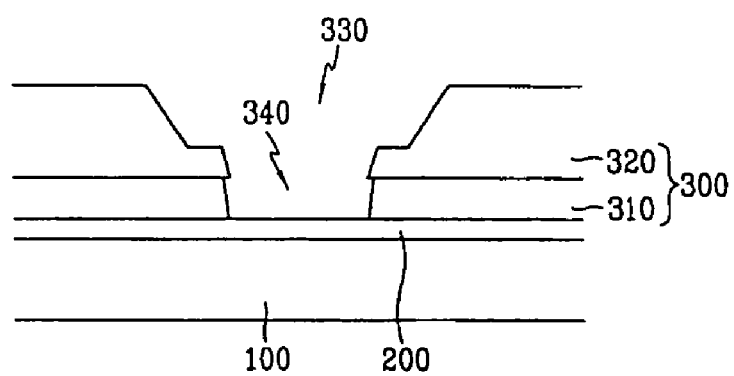
FIG. 1F is a sectional view of a contact structure of a semiconductor device illustrating a manufacturing method thereof according to another embodiment of the present invention.

FIG. 1F is a sectional view of a contact structure of a semiconductor device illustrating a manufacturing method thereof according to another embodiment of the present invention.

Referring to FIG. 1F, a lower insulating layer 310 is deposited on a substrate 100 provided with a lower wire 200 thereon. An upper insulating layer 320 preferably made of photosensitive organic material is coated on the lower insulating layer 310, and exposed to light through a photomask to form an upper contact hole 330 exposing a portion of the lower insulating layer 310 on the lower wire 200. Either the width of the upper contact hole 330 decreases as goes down, or the sidewall thereof has a stepwise shape. These configurations are obtained by providing slits or translucent film at the circumference of a portion of the photomask corresponding to the upper contact hole 330 for adjusting the illumination of the light. Related techniques will be described later in detail with reference to a method of manufacturing a TFT array panel.

Subsequently, the lower insulating layer 310 is etched using the upper insulating layer 320 as an etch mask to form a lower contact hole 340 exposing the lower wire 200.

Then, an upper wire 500 electrically connected to the lower wire 200 via the upper and the lower contact holes 330 and 340 is formed on the upper insulating layer 320.

A method of manufacturing a contact structure of a semiconductor device according to another embodiment of the present invention will be described with reference to FIG. 1G.

Figure 1G:
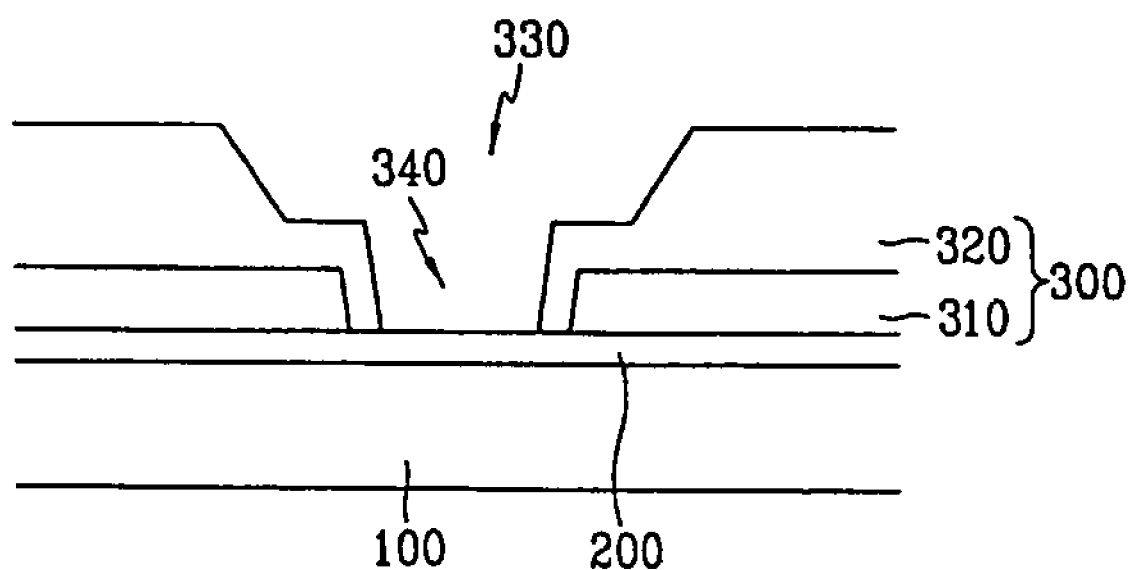
FIG. 1G is a sectional view of a contact structure of a semiconductor device illustrating a manufacturing method thereof according to another embodiment of the present invention.

FIG. 1G is a sectional view of a contact structure of a semiconductor device illustrating a manufacturing method thereof according to another embodiment of the present invention.

Referring to FIG. 1G, a lower insulating layer 310 is deposited on a substrate 100 provided with a lower wire 200 thereon. An upper insulating layer 320 preferably made of photosensitive organic material is coated on the lower insulating layer 310, and exposed to light through a photomask to form an upper contact hole 330 exposing a portion of the lower insulating layer 310 on the lower wire 200.

As shown in FIG. 1G, the lower insulating layer 310 is etched using the upper insulating layer 320 as an etch mask to form a lower contact hole 340 exposing the lower wire 200. Thereafter, the upper insulating layer 320 is subject to reflow such that a portion of the upper insulating layer 320 defining the upper contact hole 330 flows into the lower contact hole 340 to reduce the width of the lower contact hole 340.

Then, an upper wire 500 electrically connected to the lower wire 200 via the upper and the lower contact holes 330 and 340 is formed on the upper insulating layer 320.

The reflow is preferably added into the manufacturing method shown in FIG. 1F, after forming the lower contact hole 340 such that a portion of the upper insulating layer 320 defining the upper contact hole 330 flows into the lower contact hole 340.

The above-described contact structure and manufacturing method thereof are adaptable to a TFT array panel for an LCD and a manufacturing method thereof.

An LCD includes a pair of panels and a liquid crystal layer interposed therebetween. One of the pair of panels is called a "TFT array panel" including a plurality of TFTs, a plurality of pixel electrodes and a plurality of display signal lines, and each pixel electrode is connected to the signal lines via at least one of the TFTs. The other panel includes a reference electrode generating electric field in cooperation with the pixel electrodes, and preferably a plurality of color filters for color display. The pixel electrode and the reference electrode act as a liquid crystal capacitor with liquid crystal dielectric.

In the following embodiments, the above-described contact structure is mainly applied to the contact between a pixel electrode and a TFT. In addition, the following embodiments show various types of LCDs such as a transmissive type, a reflective type, and a transflective type.

First, a transflective type LCD having a contact structure according to an embodiment of the present invention will be described in detail with reference to FIGS. 2-9B.

Figure 2:
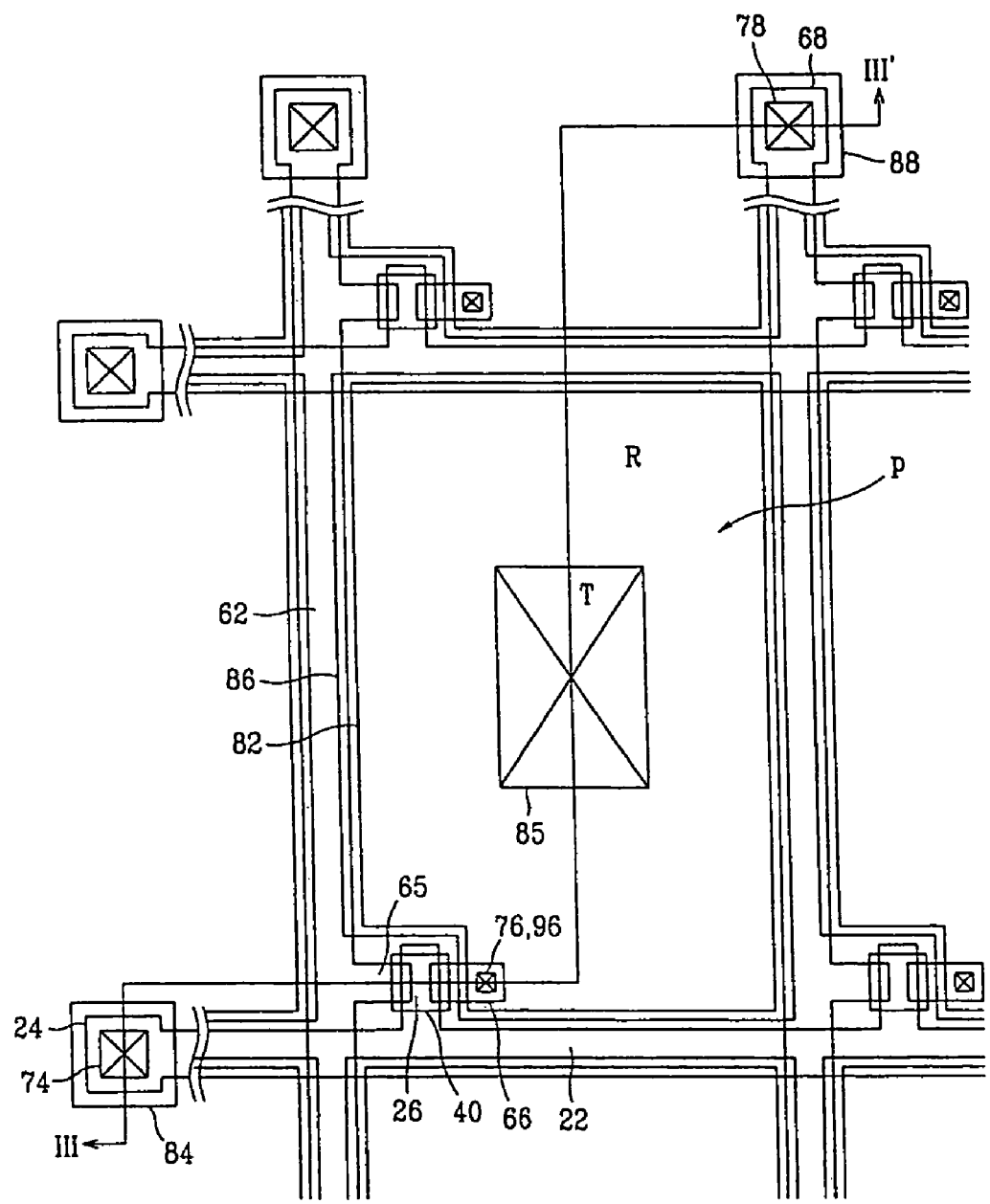
FIG. 2 is a layout view of an exemplary TFT array panel for a transflective type LCD according to an embodiment of the present invention.
Figure 3:
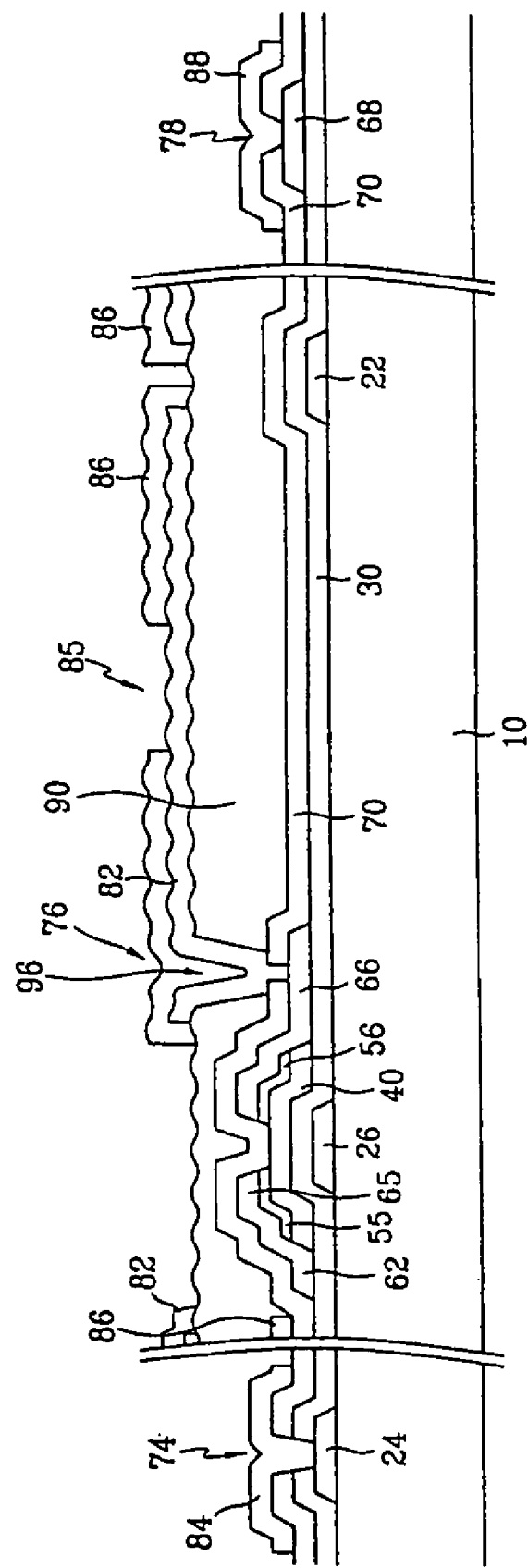
FIG. 3 is a sectional view of the TFT array panel shown in FIG. 2 taken along the line III-III'.

FIG. 2 is a layout view of an exemplary TFT array panel for a transflective type LCD according to an embodiment of the present invention, and FIG. 3 is a sectional view of the TFT array panel shown in FIG. 2 taken along the line III-III'.

A plurality of gate lines 22 extending substantially in a transverse direction are formed on an insulating substrate 10. The gate lines 22 include either a single layer preferably made of material with low resistivity such as Ag, Ag alloy, Al and Al alloy, or multiple layers including a single layer and a layer made of material with good physical and electrical contact characteristics such as Cr, Ti, and Ta. A plurality of branches of each gate line 22 form gate electrodes 26 of TFTs. The lateral sides of the gate lines 22 are tapered, and the inclination angle of the lateral sides with respect to a horizontal surface ranges 30-80 degrees.

According to another embodiment of the present invention, a plurality of storage electrodes (not shown) for storage capacitors enhancing the electrical charge storing capacity are also formed on the substrate 10. The storage electrodes are applied with a predetermined voltage such as a reference voltage or a common electrode voltage (referred to as "a common voltage" hereinafter) from an external source. The reference voltage is also applied to a reference electrode (not shown) of the other panel (not shown).

The gate lines 22 and the storage electrodes are covered with a gate insulating layer 30 preferably made of silicon nitride.

A plurality of semiconductor islands 40 preferably made of hydrogenated amorphous silicon are formed on the gate insulating layer 30 opposite the gate electrodes 26, and a plurality of pairs of ohmic contacts 55 and 56 preferably made of silicide or n+ hydrogenated amorphous silicon heavily doped with n type impurity are formed on the semiconductor islands 40. One of each pair of ohmic contacts 55 and 56 is separated from and opposite the other of the pair with respect to a corresponding one of the gate electrodes 26. The lateral sides of the semiconductor islands 40 and the ohmic contacts 55 and 56 are tapered, and the inclination angles thereof are in the range between 30-80 degrees.

A plurality of data lines 62 and a plurality of drain electrodes 66 of the TFTs are formed on the ohmic contacts 55 and 56 and the gate insulating layer 30. The data lines 62 and the drain electrodes 66 preferably include Al and Ag with low resistivity. The data lines 62 extend substantially in a longitudinal direction and intersect the gate lines 22, and a plurality of branches of each data line 62 form source electrodes 65 of the TFTs. Each pair of the source electrode 65 and the drain electrode 66 are located at least in part on a pair of the ohmic contacts 54 and 56, and separated from and opposite each other with respect to the gate electrodes 26. The data lines 62 and the drain electrodes 66 have tapered lateral sides, and the inclination angles of the lateral sides ranges 30-80 degrees.

The ohmic contacts 55 and 56 interposed between the semiconductor islands 40 and the data lines 62 and the drain electrodes 66 reduce the contact resistance therebetween.

A lower insulating layer 70 preferably made of silicon nitride is formed on the data lines 62 and portions of the semiconductor islands 40, which are not covered by the data lines 62 and the drain electrodes 66, and an upper insulating layer 90 is formed thereon. The upper insulating layer 90 is preferably made of photosensitive organic material having a good flatness characteristic. The top surface of the upper insulating layer 90 has an evenness pattern.

A plurality of pairs of contact holes 76 and 96 exposing the drain electrodes 66 are provided respectively at the lower insulating layer 70 and the upper insulating layer 90. The contact hole 96 of each pair of contact holes 76 and 96 has a larger size than the contact hole 76 to further expose the boundary of the contact hole 76 of the lower insulating layer 70 and the flat top surface of the lower insulating layer 70. Therefore, each pair of contact holes 76 and 96 has a stepwise sidewall. It is preferable that the width of the exposed top surface of the lower insulating layer 70 at the contact structure is 0.1 microns or more.

The lower insulating layer 70 further has a plurality of contact holes 78 exposing end portions 68 of the data lines 62, and the lower insulating layer 70 and the gate insulating layer 30 have a plurality of contact holes 74 exposing end portions 24 of the gate lines 22. The contact holes 74 and 78 are provided for electrical connection between the signal lines 22 and 62 and the driving circuits therefor.

The upper insulating layer 90 is removed out on pad areas provided with the contact holes 74 and 78 exposing the end portions 24 and 68 of the gate lines 22 and the data lines 62.

The removal of organic insulating material on the pad areas enhances the adhesiveness between the TFT array panel and driving integrated circuits ("ICs") thereof, especially for a chip on glass ("COG") type LCD where a plurality of gate driving ICs and/or a plurality of data driving ICs for respectively transmitting the scanning signals and the image signals to the gate lines 22 and the data lines 62 are mounted on the TFT array panel.

A plurality of transparent electrodes 82 are formed on the upper insulating layer 90. Each transparent electrode 82 is electrically connected to appropriate one of the drain electrodes 66 through the corresponding contact holes 76 and 96.

A plurality of reflecting electrodes 86 are formed on the respective transparent electrodes 82. Each reflecting electrode 86 has an aperture 85 exposing an underlying transparent electrode 82. Among the entire area P of the transparent electrode 82 or the reflecting electrode 86, an area T defined by the aperture 85 is referred to as a "transmitting area," while a remaining area R is referred to as a "reflecting area."

The transparent electrodes 82 are preferably made of transparent conductive material such as indium zinc oxide ("IZO") and indium tin oxide ("ITO"), while the reflecting electrodes 86 are preferably made of reflective material such as Al, Al alloy, Ag, and Ag alloy.

Each pair of the reflecting electrode 86 and the transparent electrode 82 has embossment along the unevenness pattern of the upper insulating layer 90 for enhancing the reflectance of the reflecting electrode 86.

Each pair of the reflecting electrode 86 and the transparent electrode 82 applied with voltages from the data lines 62 generates electric fields in cooperation with a reference electrode provided on the other panel, and the variation of the applied voltage changes the orientations of liquid crystal molecules in a liquid crystal layer between two field-generating electrodes. In view of electrical circuits, each pair of the electrodes 82 and 86 and the reference electrode form a capacitor with liquid crystal dielectric for storing electrical charges.

The electrodes 82 and 86 overlap the gate lines 22 and the data lines 62 to increase aperture ratio and to form a plurality of storage capacitors, connected parallel to the liquid crystal capacitors, for enhancing the charge storing capacity thereof.

The electrodes 82 and 86 have embossment along the unevenness pattern of the upper insulating layer 90 for enhancing the reflectance of the reflecting electrode 86.

A contact assistant layer (not shown) preferably made of material having a good contact characteristic with other materials such as Mo, Mo alloy, Cr, Ti, and Ta is preferably provided between the reflecting electrode 86 and the transparent electrode 82 to ensure good physical and electrical contacts therebetween.

Furthermore, a plurality of contact assistants 84 and 88 are formed on the lower insulating layer 70. The contact assistants 84 and 88 are connected to the exposed end portions 24 and 68 of the gate and to the data lines 22 and 62 through the contact holes 74 and 78, respectively. The contact assistants 84 and 88 are not required but are preferred to protect the exposed portions 24 and 68 of the gate and the data lines 22 and 62, and to complement the adhesiveness of the TFT array panel and the driving ICs. The contact assistants 84 and 88 are made of the same layer either as the transparent electrodes 82, or as the reflecting electrode 86.

According to another embodiment of the present invention, a plurality of metal islands (not shown) preferably made of the same material as the gate lines 22 or the data lines 62 are provided near the end portions of the gate and/or the data lines 22 and 62. The metal islands are connected to the contact assistants 84 or 88 via a plurality of contact holes provided at the gate insulating layer 30 and/or the lower insulating layer 70.

A method of manufacturing a TFT array panel for a transflective type LCD according to an embodiment of the present invention will be now described in detail with reference to FIGS. 4A to 9B as well as FIGS. 2 and 3.

FIGS. 4A, 5A, 6A, 7A, 8A and 9A are layout views of a TFT array panel for a transflective type LCD in the respective steps of a manufacturing method thereof according to an embodiment of the present invention, and FIGS. 4B, 5B, 6B, 7B, 8B and 9B are sectional views of the TFT array panel shown in FIGS. 4A, 5A, 6A, 7A, 8A and 9A taken along the lines IVB-IVB', V-V', VIB-VIB', VIIB-VIIB', VIIIB-VIIIB' and IXB-IXB', respectively.

Figure 4A:
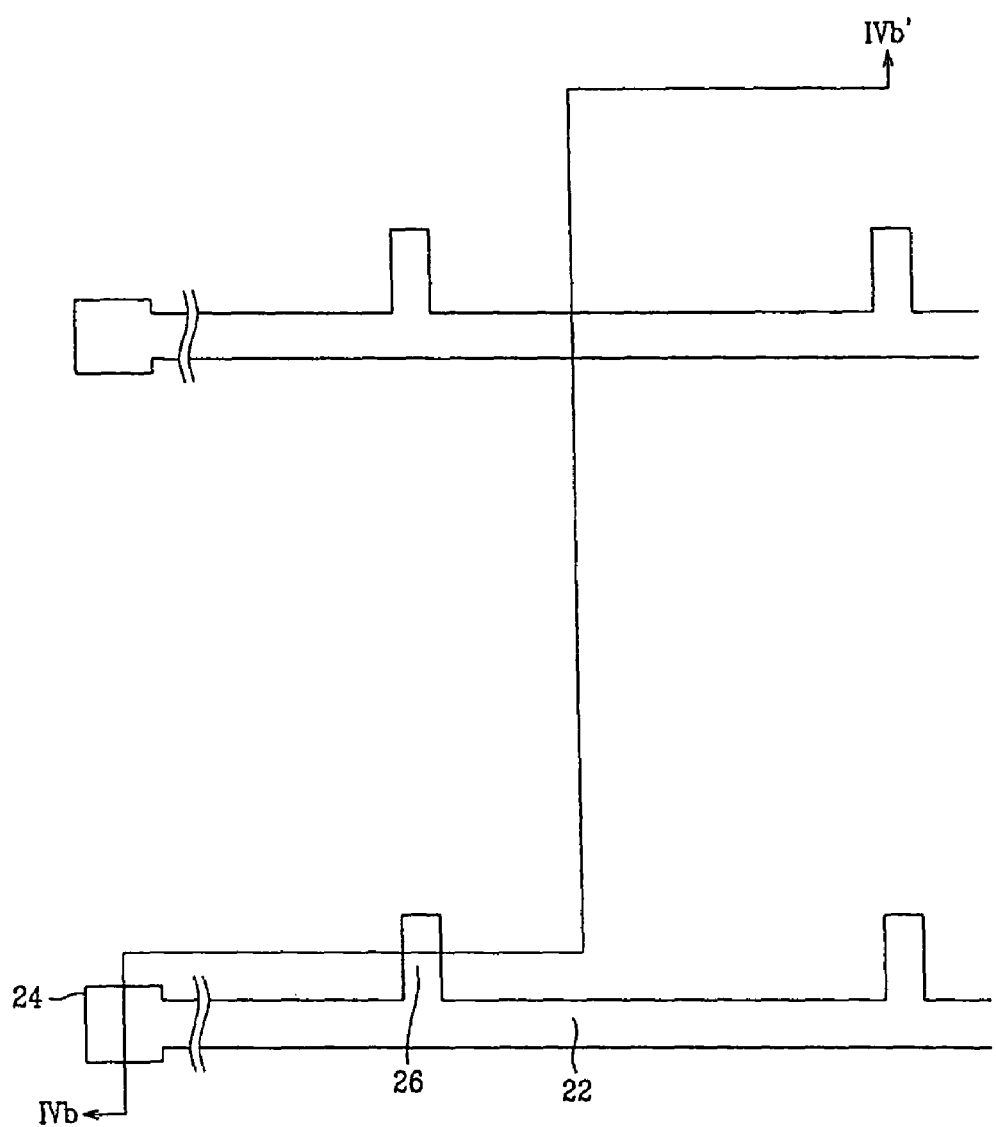
FIGS. 4A, 5A, 6A, 7A, 8A and 9A are layout views of a TFT array panel for a transflective type LCD in the respective steps of a manufacturing method thereof according to an embodiment of the present invention.
Figure 4B:
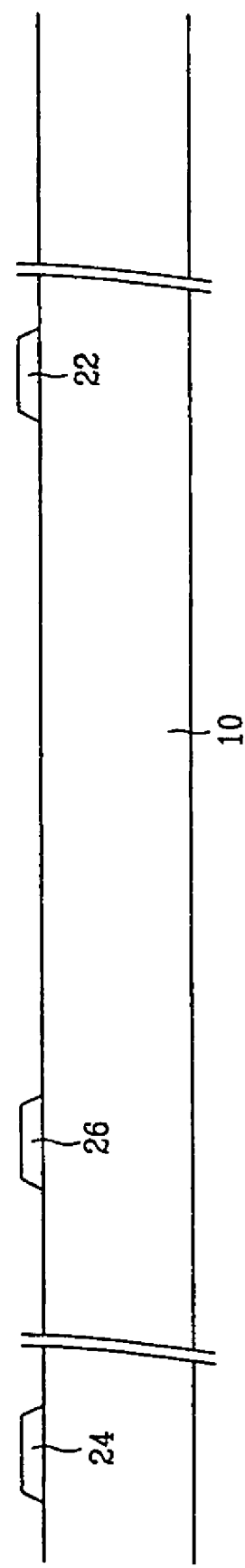
FIGS. 4B, 5B, 6B, 7B, 8B and 9B are sectional views of the TFT array panel shown in FIGS. 4A, 5A, 6A, 7A, 8A and 9A taken along the lines IVB-IVB', V-V', VIB-VIB', VIIB-VIIB', VIIIB-VIIIB' and IXB-IXB', respectively.

As shown in FIGS. 4A and 4B, a plurality of gate lines 22 including a plurality of gate electrodes 26 are formed on a glass substrate 10 by photo-etching.

Figure 5A:
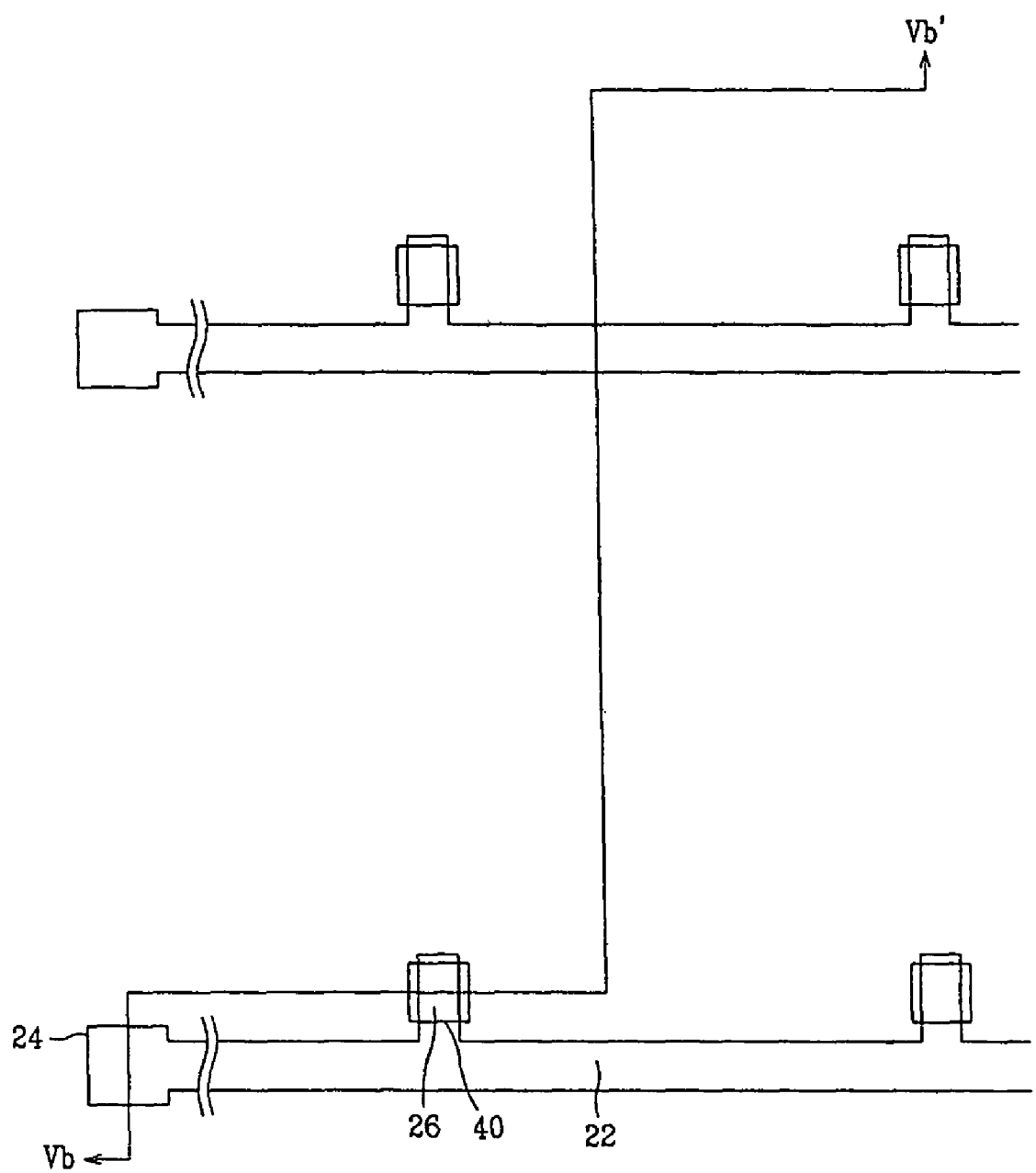
Figure 5B:
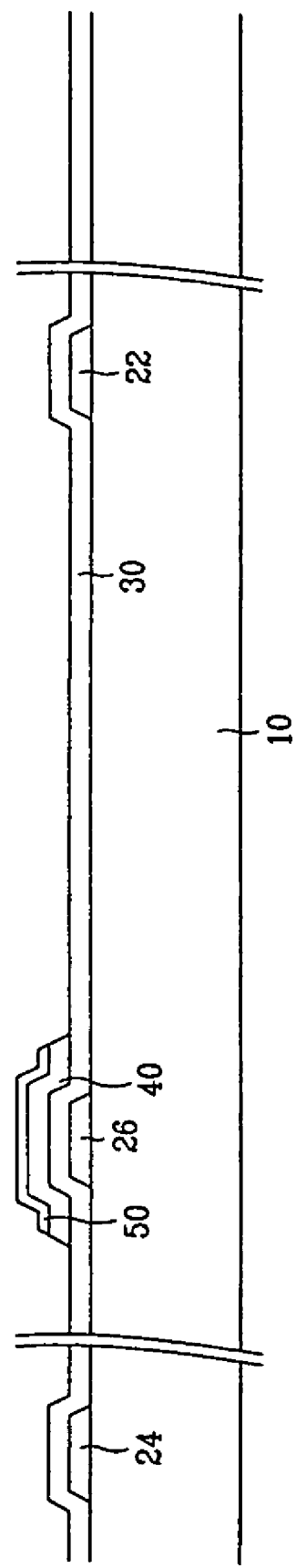

Next, as shown in FIGS. 5A and 5B, after sequentially depositing a gate insulating layer 30, an amorphous silicon layer, and a doped amorphous silicon layer, the doped amorphous silicon layer and the amorphous silicon layer are photo-etched to form a plurality of semiconductor islands 40 and a plurality of doped amorphous silicon islands 50 on the gate insulating layer 30 opposite the gate electrodes 24.

Figure 6A:
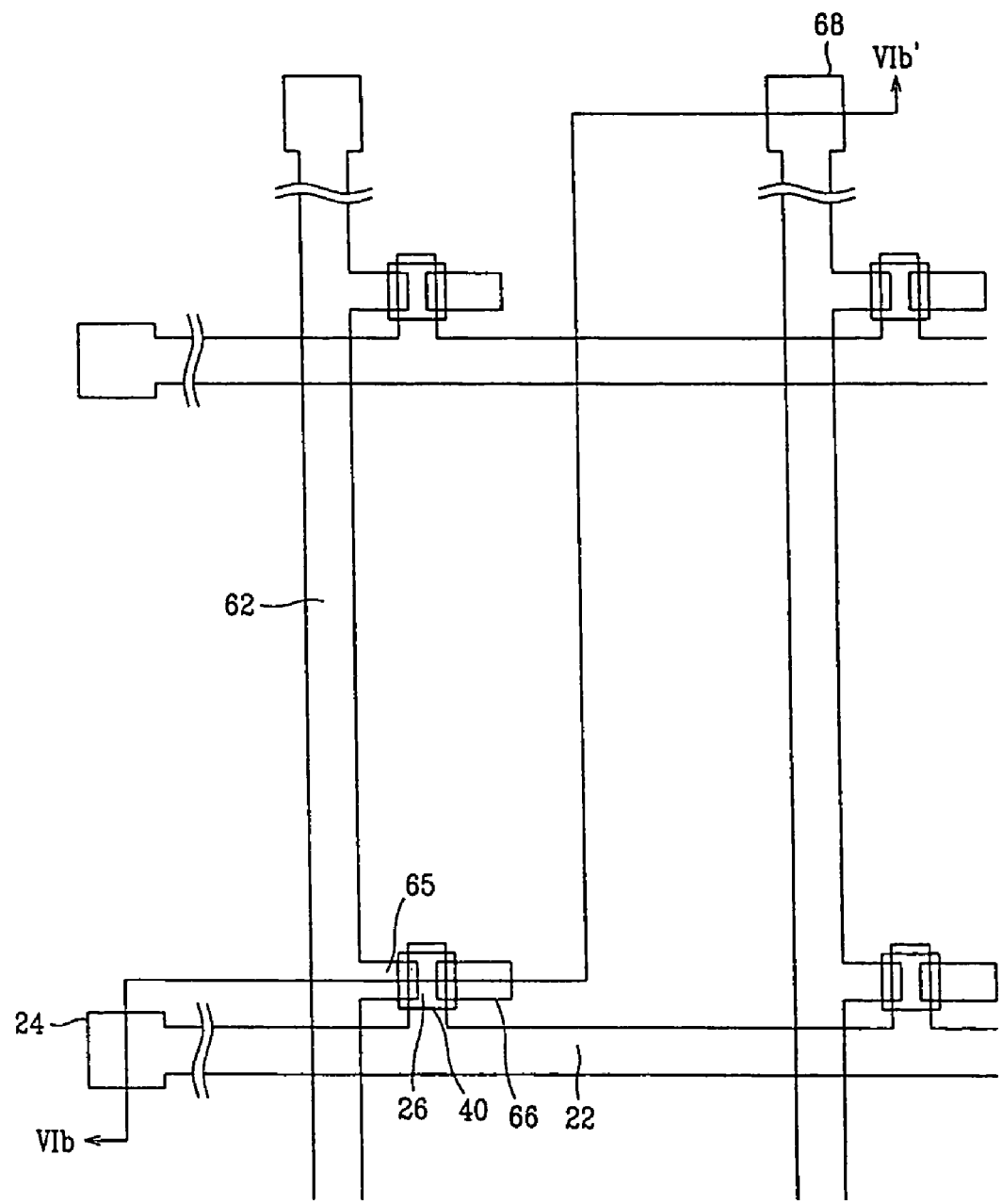
Figure 6B:
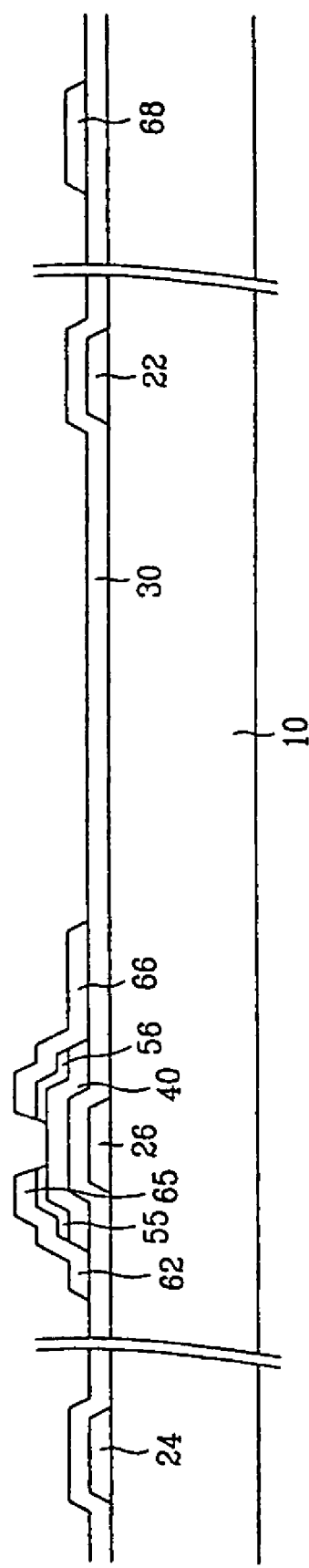

Subsequently, as shown in FIGS. 6A and 6B, a plurality of data lines 65 including a plurality of source electrodes 65 and a plurality of drain electrodes 66 are formed by photo-etching. Thereafter, portions of the doped amorphous silicon islands 50, which are not covered by the data lines 62 and the drain electrodes 66, are removed such that each doped amorphous silicon island 50 is separated into two ohmic contacts 55 and 56 to expose a portion of the underlying semiconductor island 40 located therebetween. Oxygen plasma treatment is preferably performed to stabilize exposed surfaces of the semiconductor islands 40.

Figure 7A:
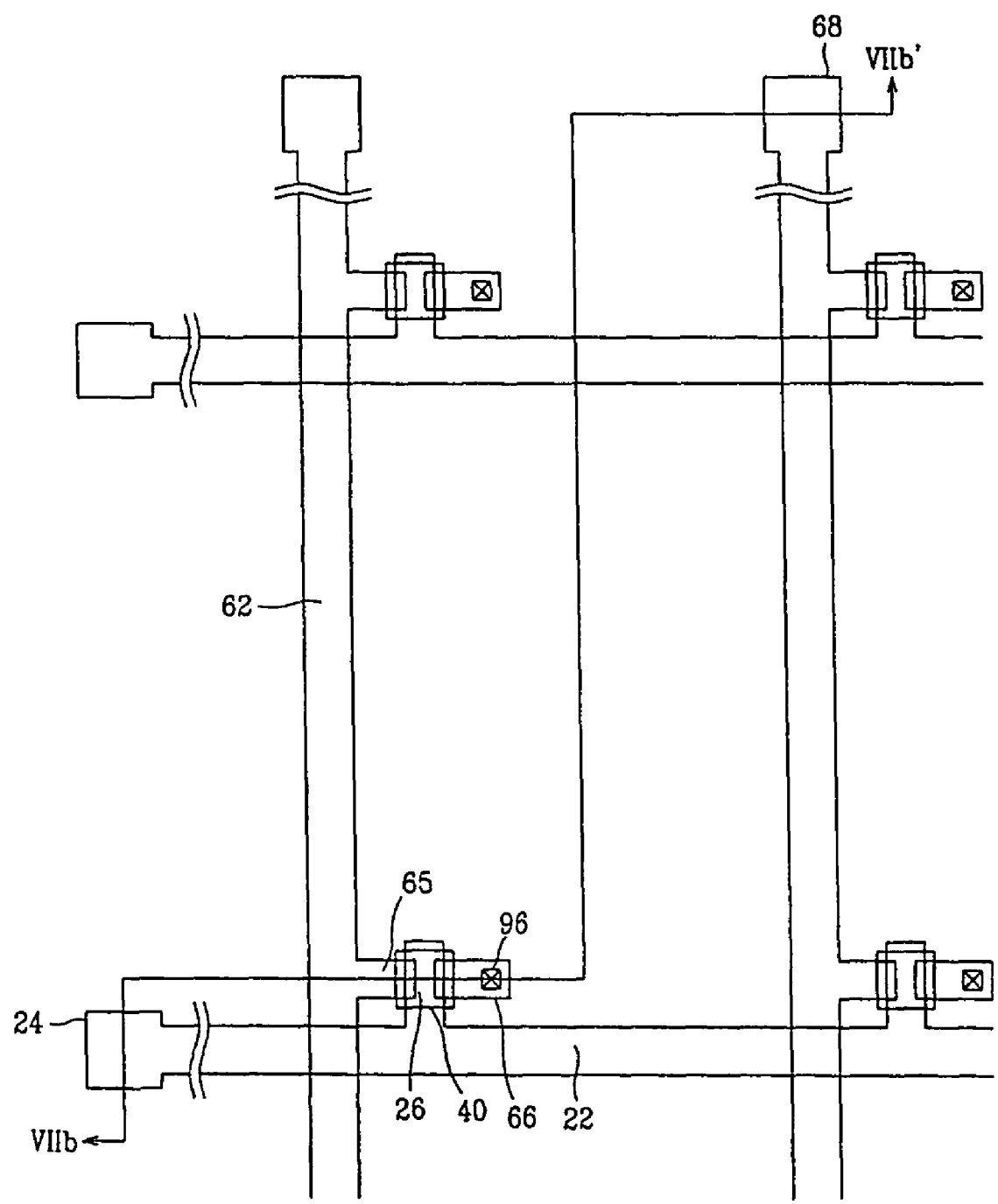
Figure 7B:
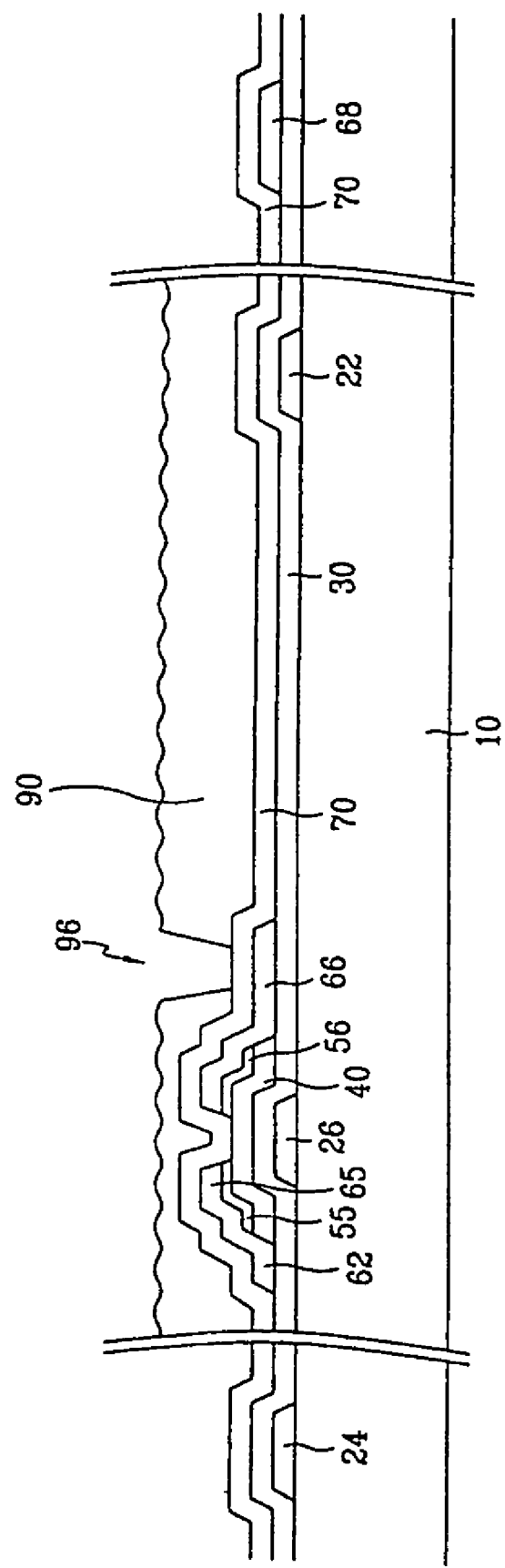

As shown in FIGS. 7A and 7B, a lower insulating layer 70 made of silicon nitride is deposited by CVD (Chemical Vapor Deposition), and an upper insulating layer 90 made of a photosensitive organic material is coated thereon. Thereafter, the upper insulating layer 90 is exposed to light through a mask and developed such that a plurality of contact holes 96 exposing portions of the lower insulating layer 70 on the drain electrodes 66 are provided at the upper insulating layer 90, an unevenness pattern is provided on the surface of the upper insulating layer 90, and portions of the upper insulating layer 90 on pad areas are removed to expose the lower insulating layer 70.

Figure 8A:
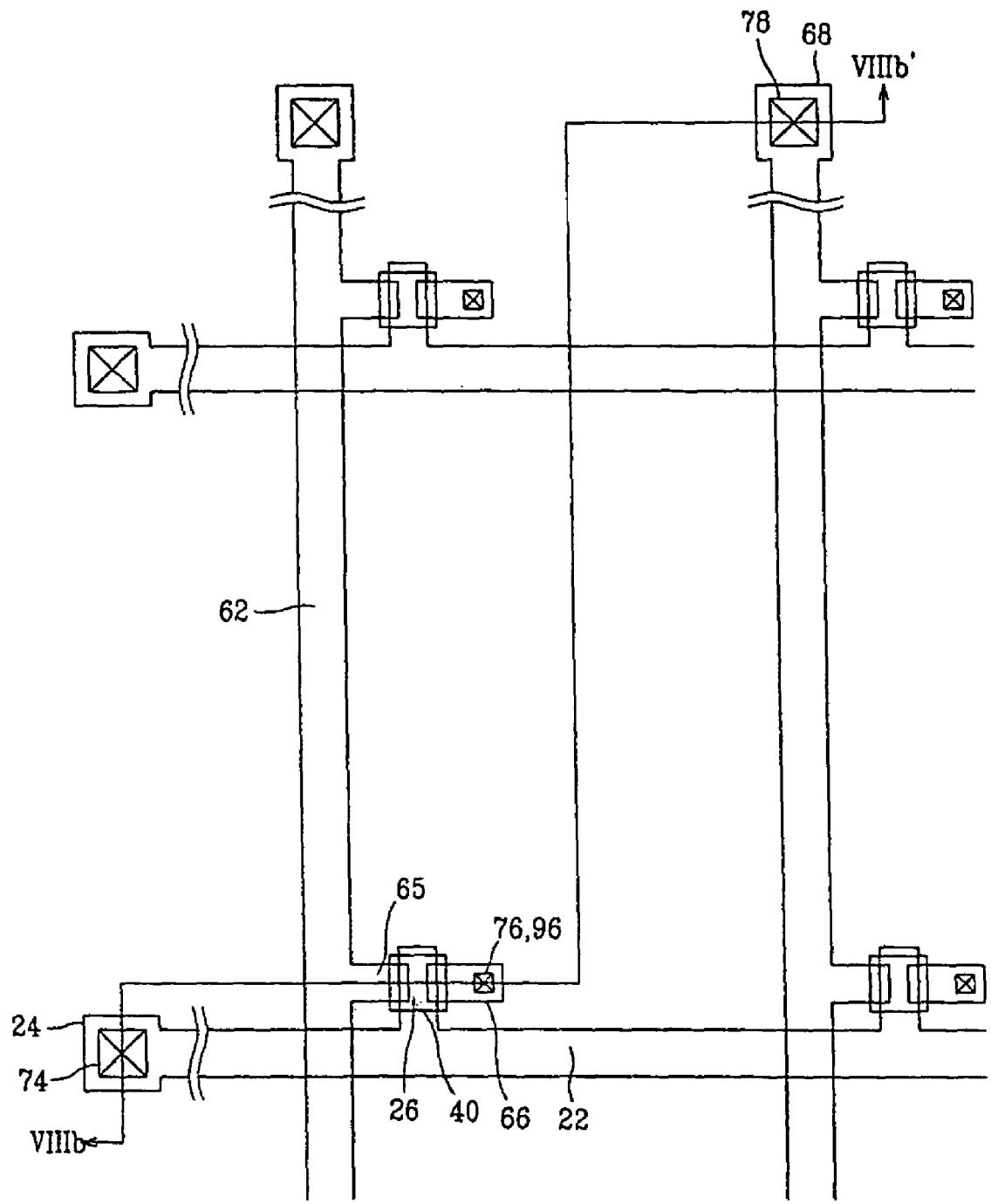
Figure 8B:
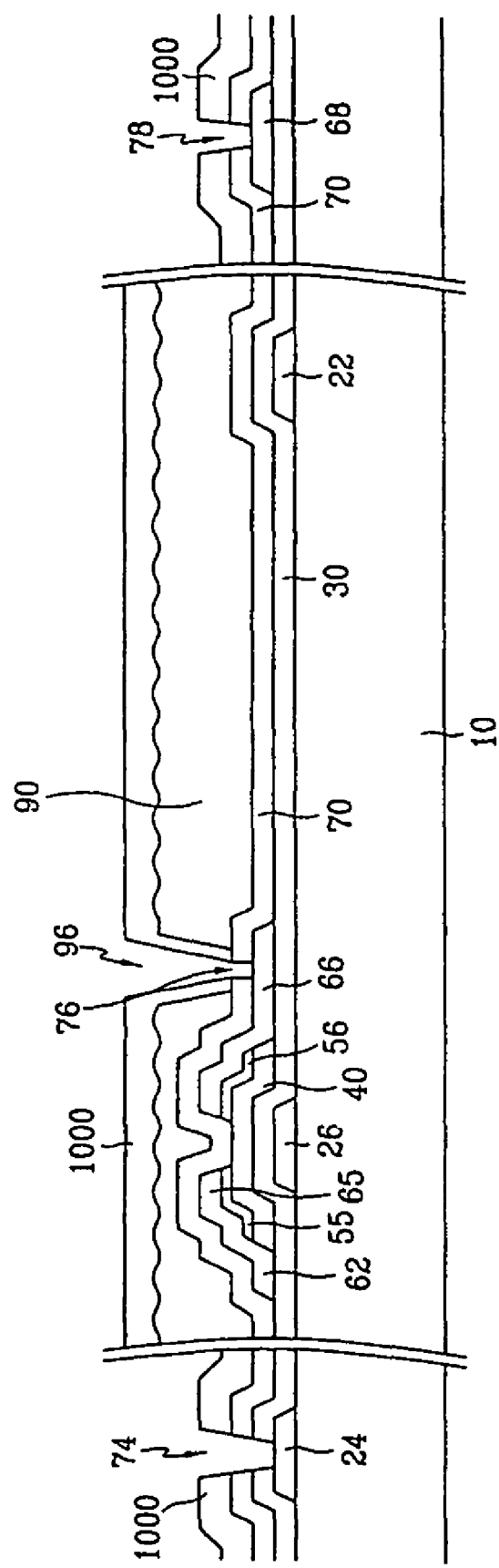

Subsequently, as shown in FIGS. 8A and 8B, the lower insulating layer 70 and the gate insulating layer 30 are patterned by photo-etching using a photoresist pattern 1000 to form a plurality of contact holes 74, 76 and 78 exposing the end portions 24 of the gate lines 22, the drain electrodes 66, and the end portions 68 of the data lines 62, respectively. The openings of the photoresist pattern 1000 are located in the contact holes 96 of the upper insulating layer 90.

According to another embodiment of the present invention, the contact holes 74, 76 and 78 of the lower insulating layer 70 and/or the gate insulating layer 30 are formed by using the upper insulating layer 90 with the contact holes 96 as an etch mask without using a separate photoresist pattern. The lateral sides of the upper insulating layer 90 defining the contact holes 96 have stepwise shapes. Alternatively, each pair of the contact holes 76 and 96 has a stepwise sidewall. Such a stepwise sidewall is obtained by enlarging the contact hole 96 of the upper insulating layer 90 compared with the contact holes 76 of the lower layer 70 preferably by means of ashing, or by reducing the contact holes 76 of the lower layer 70 compared with the contact holes 96 of the upper insulating layer 90 preferably by means of reflow of the upper insulating layer 90. In this case, portions of the lower insulating layer 70 on the pad areas may be removed.

According to another embodiment of the present invention, a plurality of contact holes of an upper insulating layer 90 are further provided on the end portions of gate lines 22 and data lines 62 without removing all portions of the upper insulating layer 90 on the pad areas. In addition, a lower insulating layer 70 is patterned by using the upper insulating layer 90 as an etch mask as described above.

According to another embodiment of the present invention, all portions of a lower insulating layer 70 on pad areas are removed.

Figure 9A:
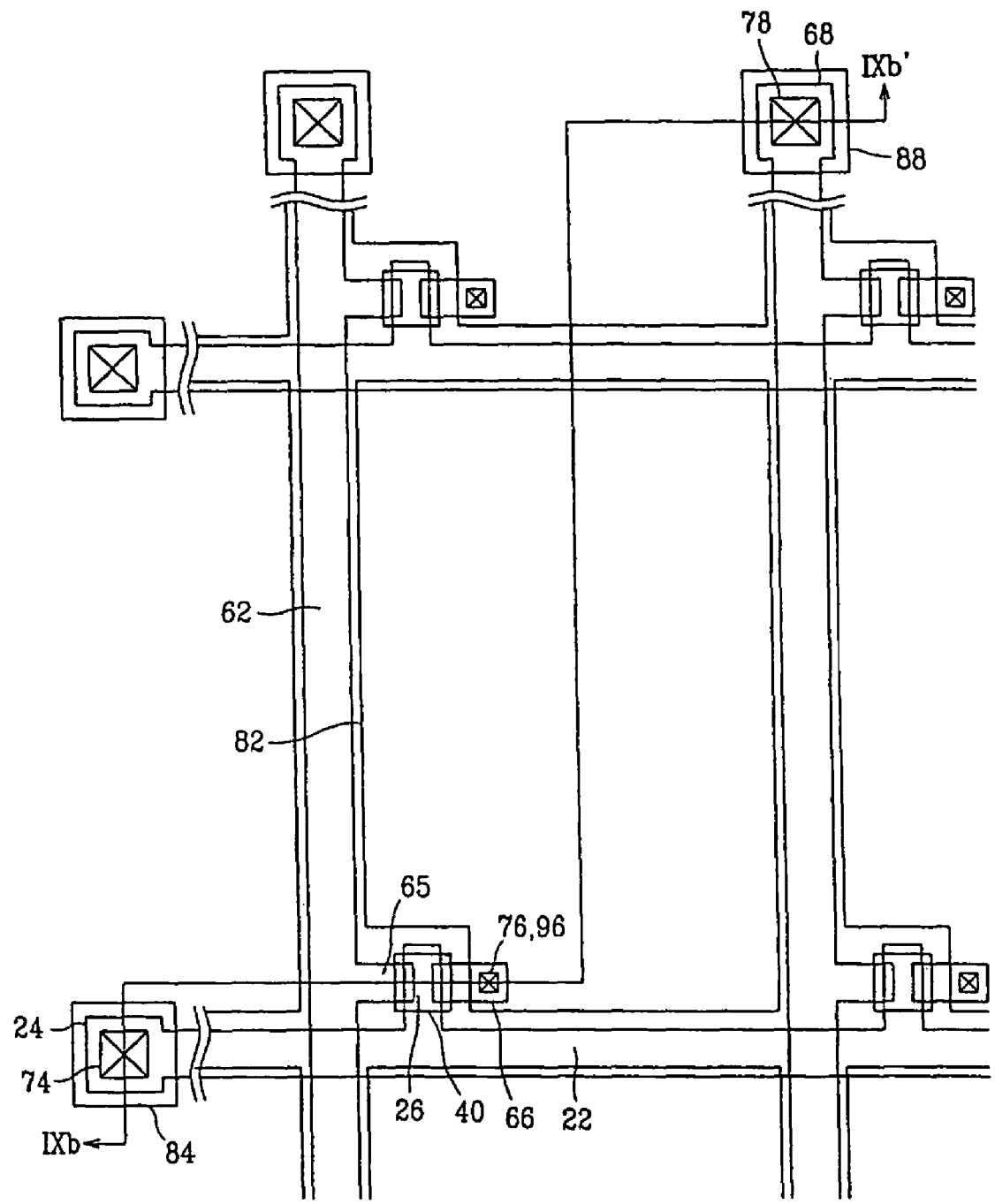
Figure 9B:
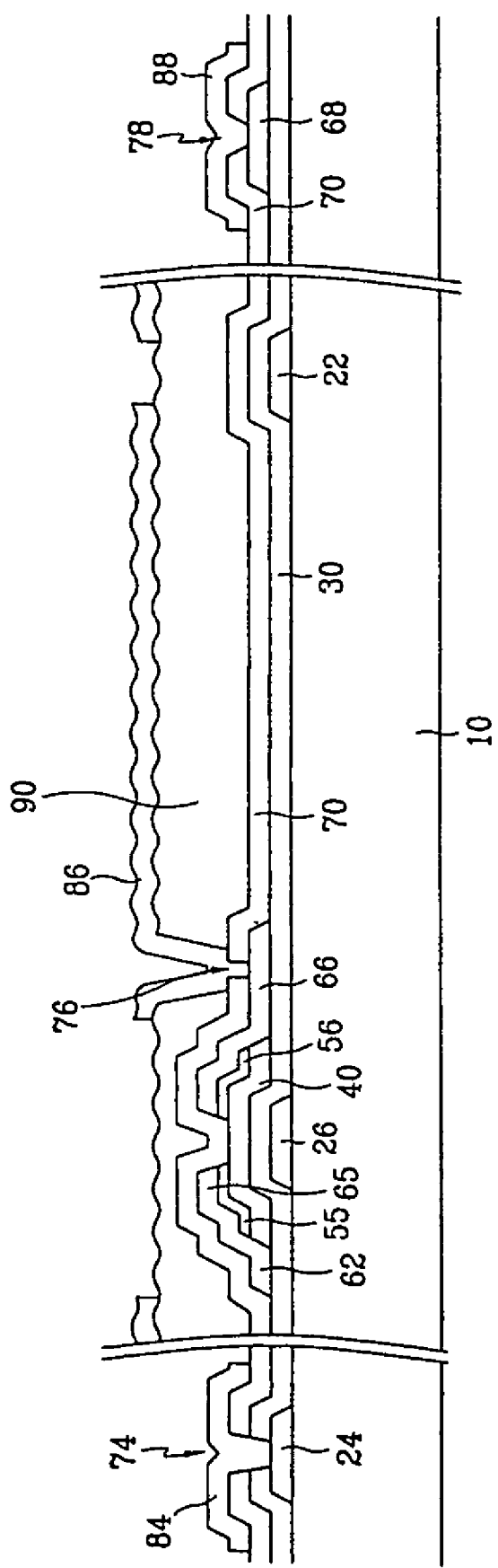

Next, as shown in FIGS. 9A and 9B, a plurality of transparent electrodes 82 and a plurality of contact assistants 84 and 88 are formed on a upper insulating layer 90 by photo-etching. Each transparent electrode 82 is connected to the corresponding one of the drain electrodes 66 through the corresponding contact holes 76 and 96, and contact assistants are connected to exposed end portions 24 and 68 of gate lines 22 and data lines 62 through contact holes 74 and 78, respectively.

Finally, as shown in FIGS. 2 and 3, a plurality of reflecting electrodes 86 preferably made of silver or aluminum are formed on respective transparent electrodes 82 by photo-etching.

The coating of the upper insulating layer 90 before patterning the lower insulating layer 70 according to this embodiment of the present invention prevents the stepped height difference of the upper insulating layer 90, thereby obtaining uniform unevenness pattern on the upper insulating layer 90. As a result, the uniform embossment of a reflecting electrode 86 follows the uniformity of the unevenness pattern of the upper insulating layer 90, which in turn prevents stains on screen displaying images.

A TFT array panel for a reflective type LCD according to an embodiment of the present invention will be described in detail with reference to FIGS. 10 and 11.

Figure 10:
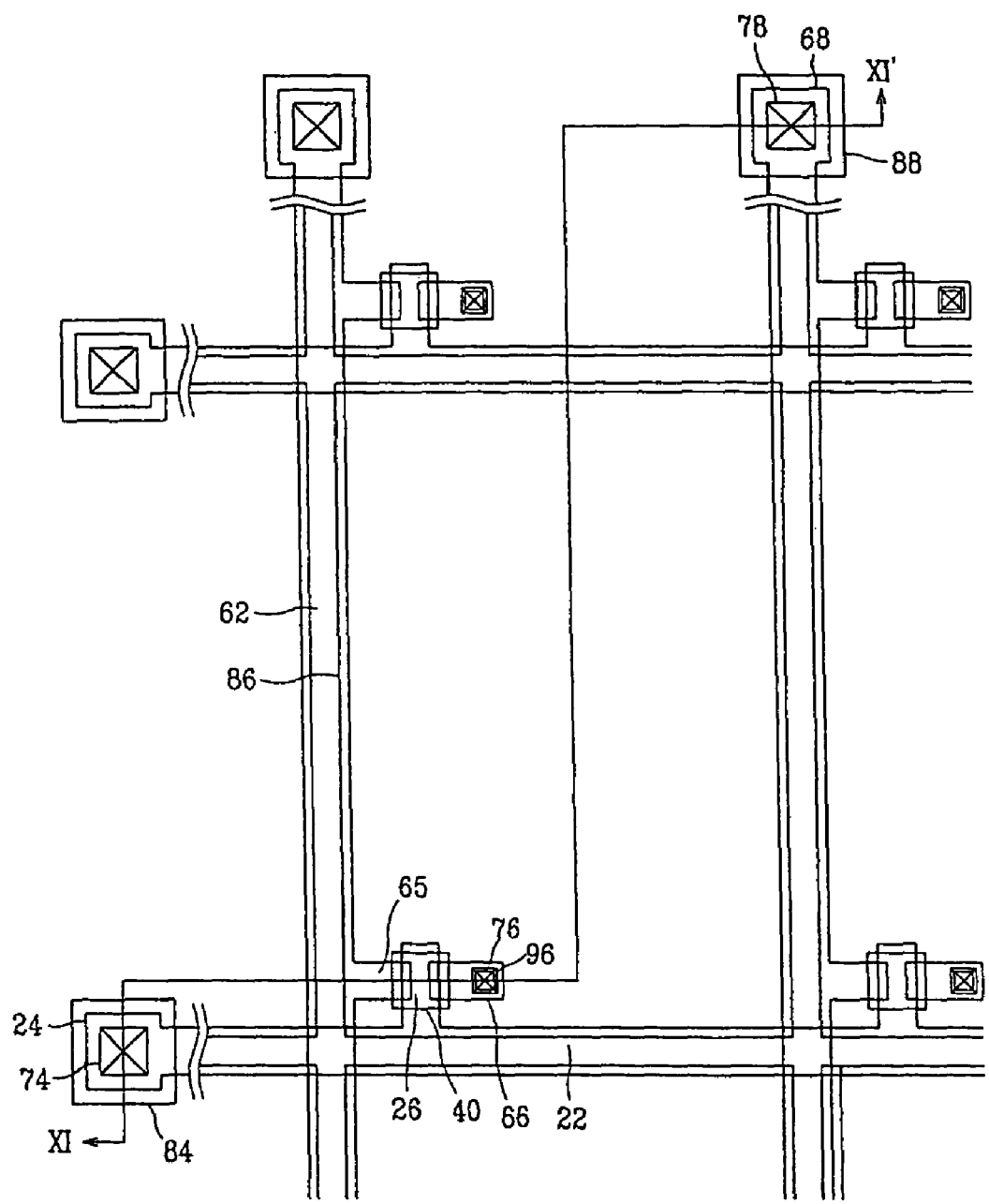
FIG. 10 is a layout view of an exemplary TFT array panel for a reflective type LCD according to an embodiment of the present invention.
Figure 11:
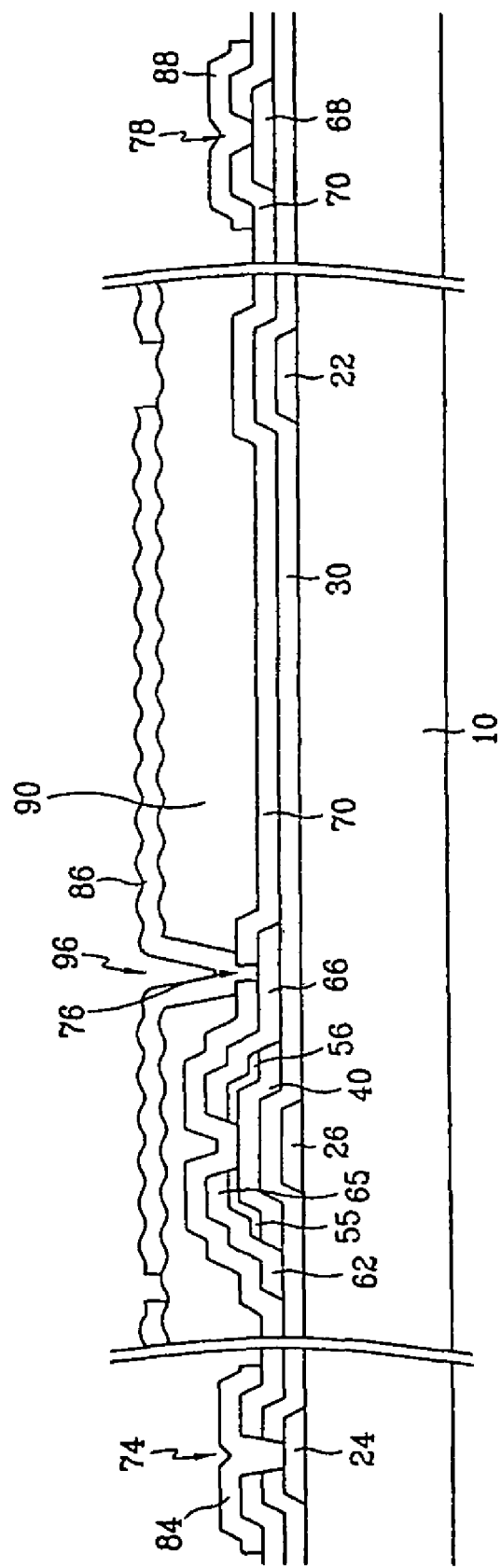
FIG. 11 is a sectional view of the TFT array panel shown in FIG. 10 taken along the line XI-XI'.

FIG. 10 is a layout view of an exemplary TFT array panel for a reflective type LCD according to an embodiment of the present invention, and FIG. 11 is a sectional view of the TFT array panel shown in FIG. 10 taken along the line XI-XI'.

Different from the TFT array panel shown in FIGS. 2 and 3, the TFT array panel according to this embodiment has no transparent electrode. As a result, a plurality of reflecting electrodes 86 are located directly on an upper insulating layer 90 placed on a lower insulating layer 70 and in direct electrical connection with a plurality of drain electrodes 66 through contact holes 76 and 96 respectively provided on the lower insulating layer 70 and the upper insulating layer 90. In addition, the reflecting electrode 86 has no aperture.

A TFT array panel for a transmissive type LCD according to an embodiment of the present invention will be described in detail with reference to FIGS. 12 and 13.

Figure 12:
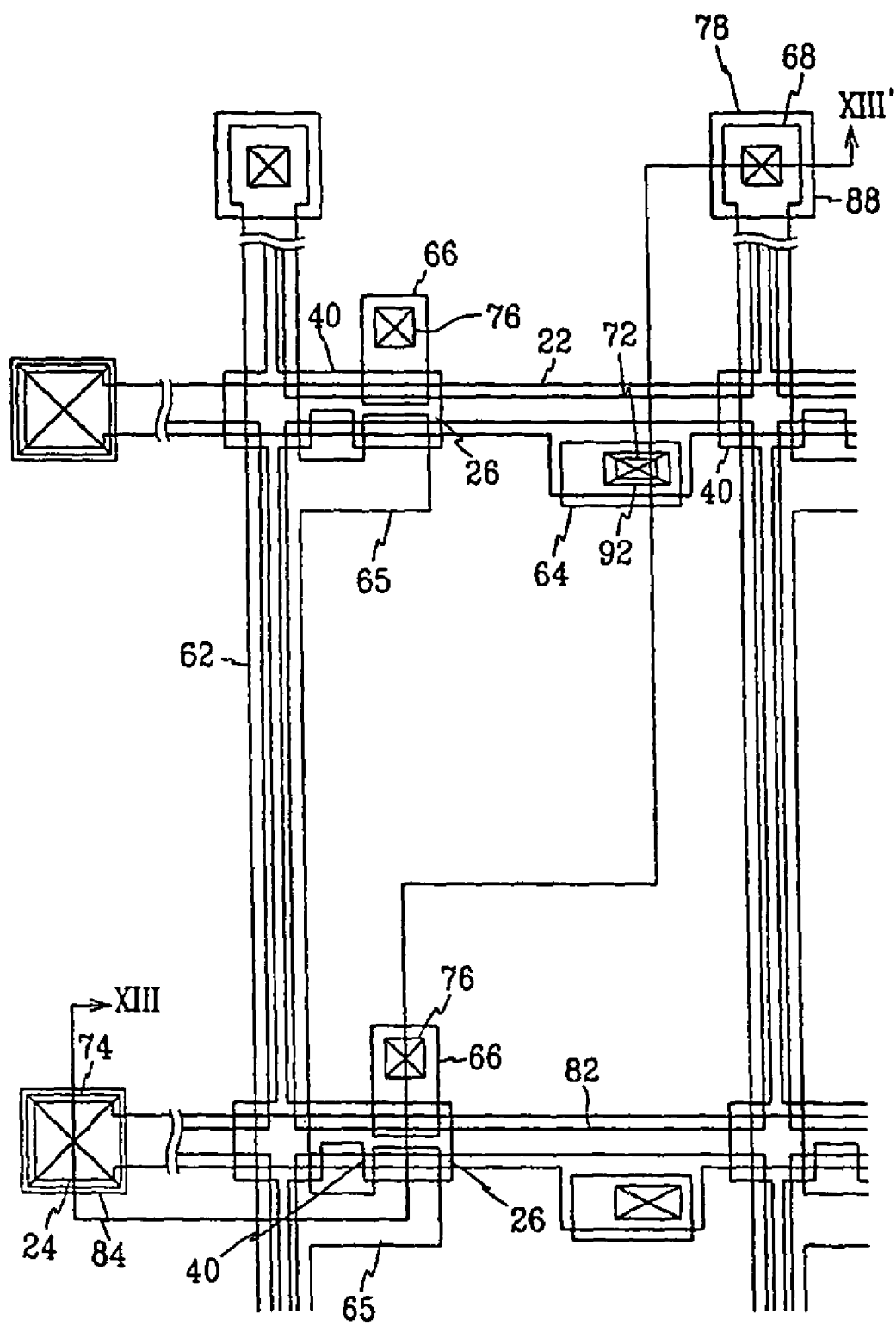
FIG. 12 is a layout view of an exemplary TFT array panel for a transmissive LCD according to an embodiment of the present invention.
Figure 13:
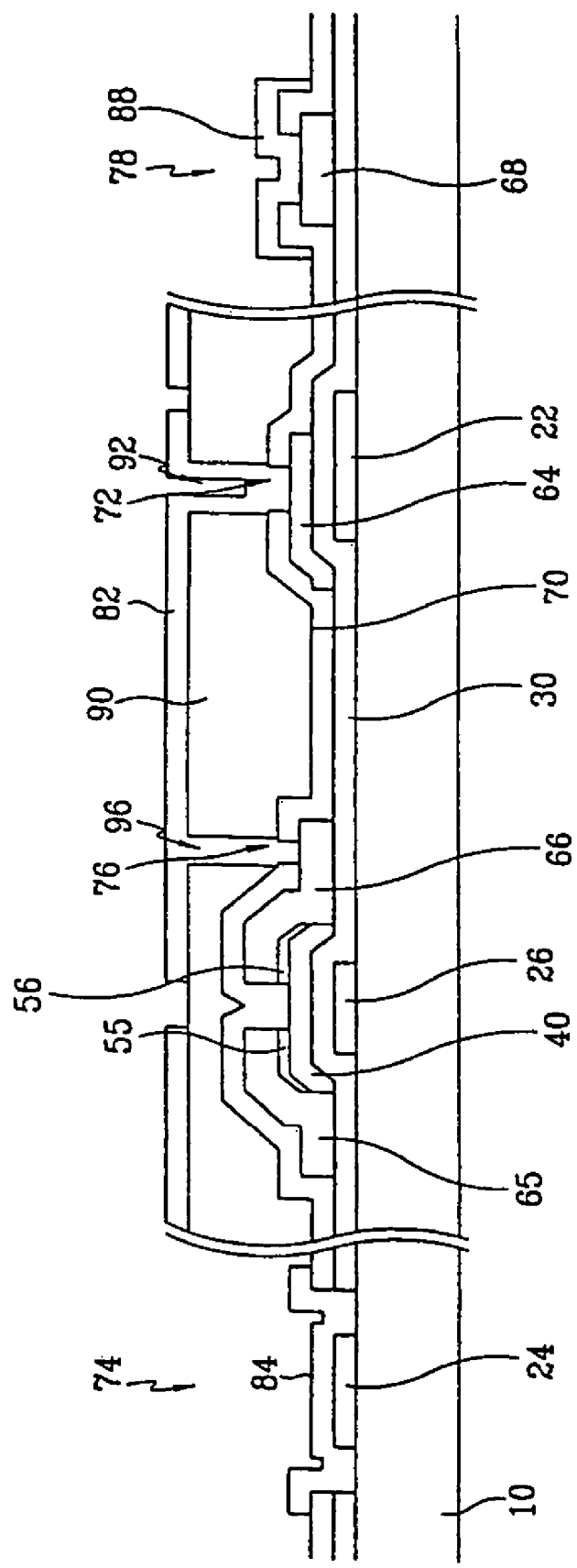
FIG. 13 is a sectional view of the TFT array panel shown in FIG. 12 taken along the line XII-XII'.

FIG. 12 is a layout view of an exemplary TFT array panel for a transmissive type LCD according to an embodiment of the present invention, and FIG. 13 is a sectional view of the TFT array panel shown in FIG. 12 taken along the line XIII-XIII'.

Different from the TFT array panel shown in FIGS. 2 and 3, the TFT array panel according to this embodiment has a plurality of transparent electrodes 86 but no reflecting electrode.

In addition, each gate line 22 has a plurality of expansions wider than the other portions, and a plurality of storage conductors 64 are additionally provided between a gate insulating layer 30 and a lower insulating layer 70 under an upper insulating layer 90. Each transparent electrode 82 is electrically connected to appropriate one of the storage conductors 64 through the contact holes 72 and 92 respectively provided at the lower and the upper insulating layers 70 and 90, and each storage conductor 64 overlaps the expansion of the gate line 22 to obtain sufficient storage capacitance. Each pair of the contact holes 72 and 92 as well as each pair of contact holes 76 and 96 has stepwise sidewall to prevent disconnection of the transparent electrode 82.

Furthermore, each contact hole 74, provided at the lower insulating layer 70 and a gate insulating layer 30, exposing an end portion 24 of the gate line 22, is wider than the end portion 24 of the gate line 22. The upper insulating layer 90 has no unevenness pattern.

Finally, there are provided a plurality of semiconductor stripes 40 under a plurality of data lines 62, and a plurality of branches of each semiconductor stripe 40 extend onto a plurality of gate electrodes 26 to form channels of TFTs. A plurality of ohmic contacts 55 and 56 are provided between the semiconductor stripes 40 and the data lines 62 and a plurality of drain electrodes 66.

A TFT array panel for a transmissive type LCD according to another embodiment of the present invention will be described in detail with reference to FIGS. 14-16.

Figure 14:
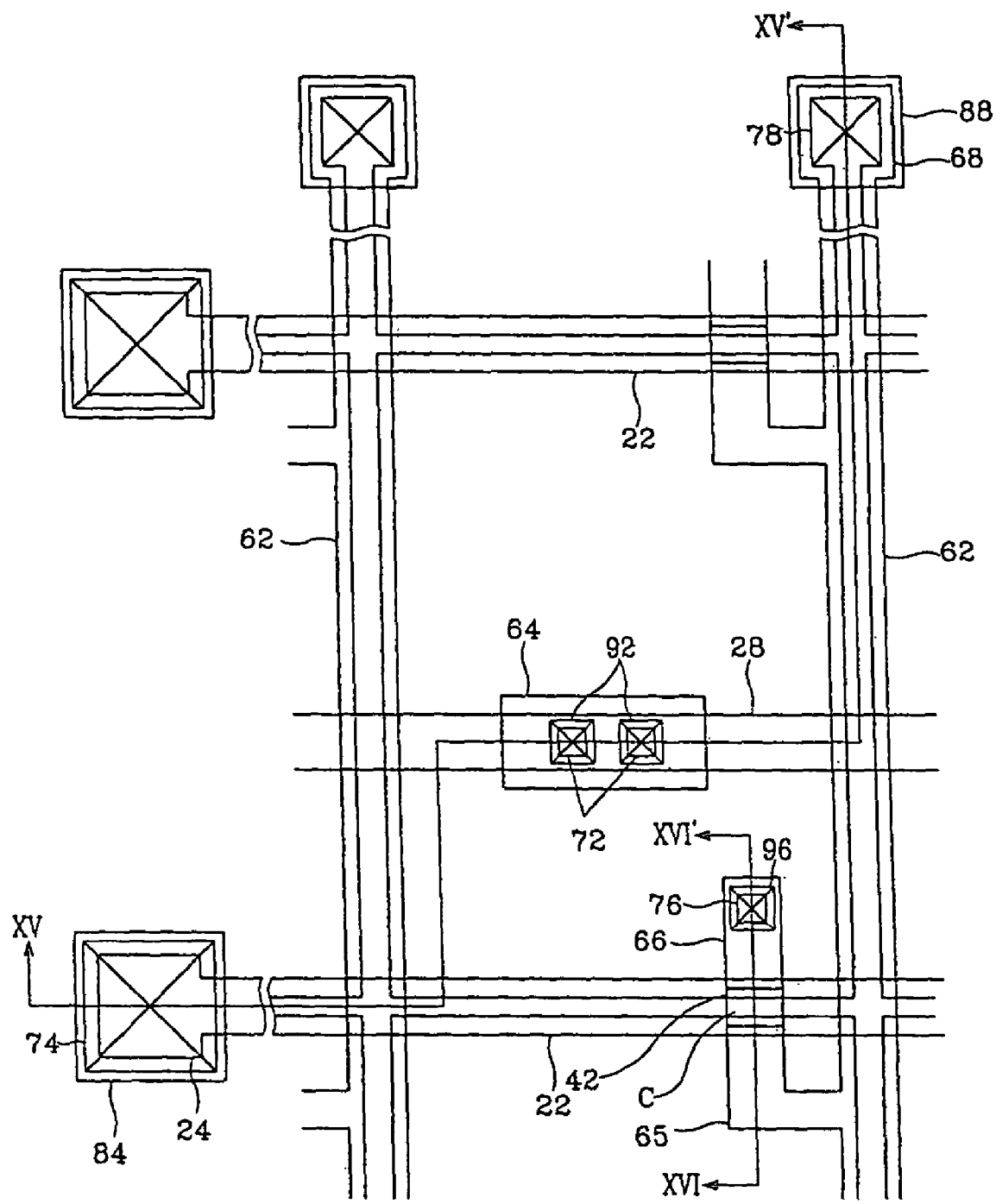
FIG. 14 is a layout view of an exemplary TFT array panel for a transmissive LCD according to another embodiment of the present invention.
Figure 15:
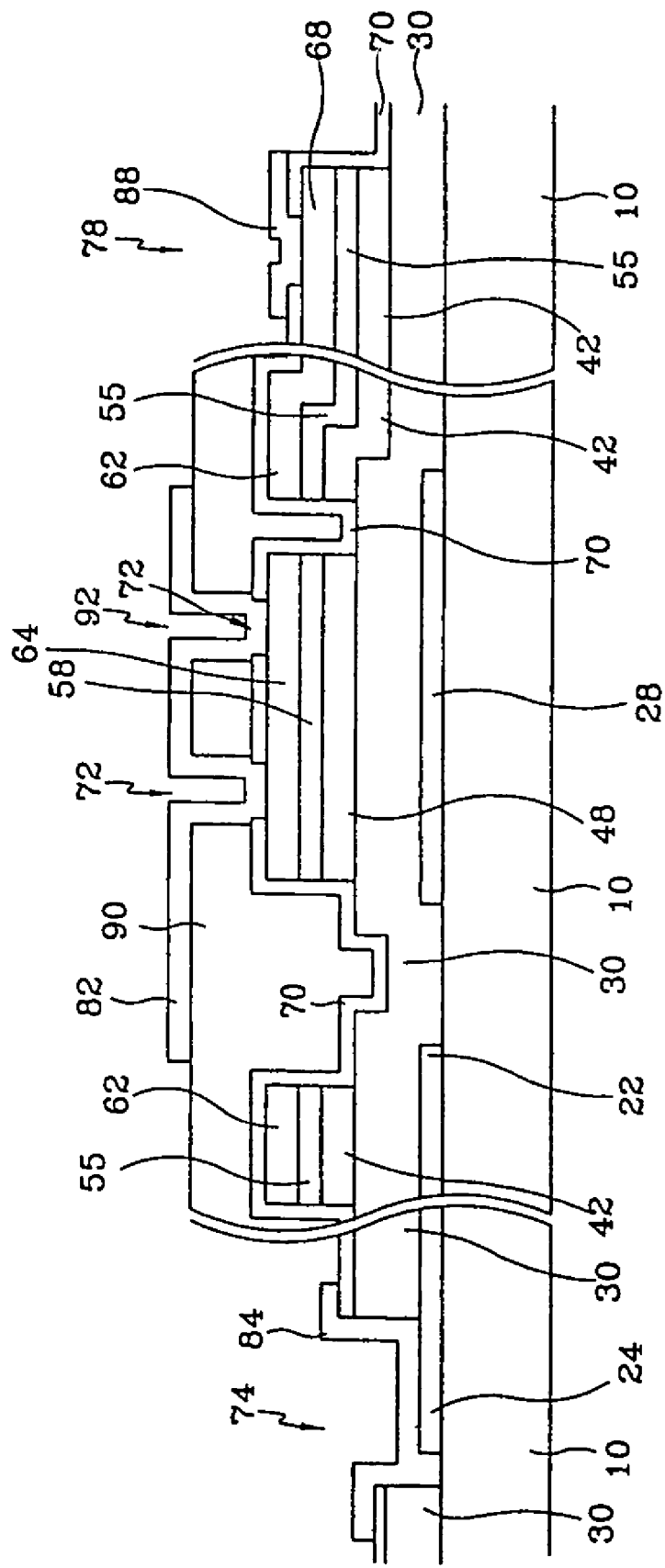
FIGS. 15 and 16 are sectional views of the TFT array panel shown in FIG. 14 taken along the line XV-XV' and the line XVI-XVI', respectively.
Figure 16:
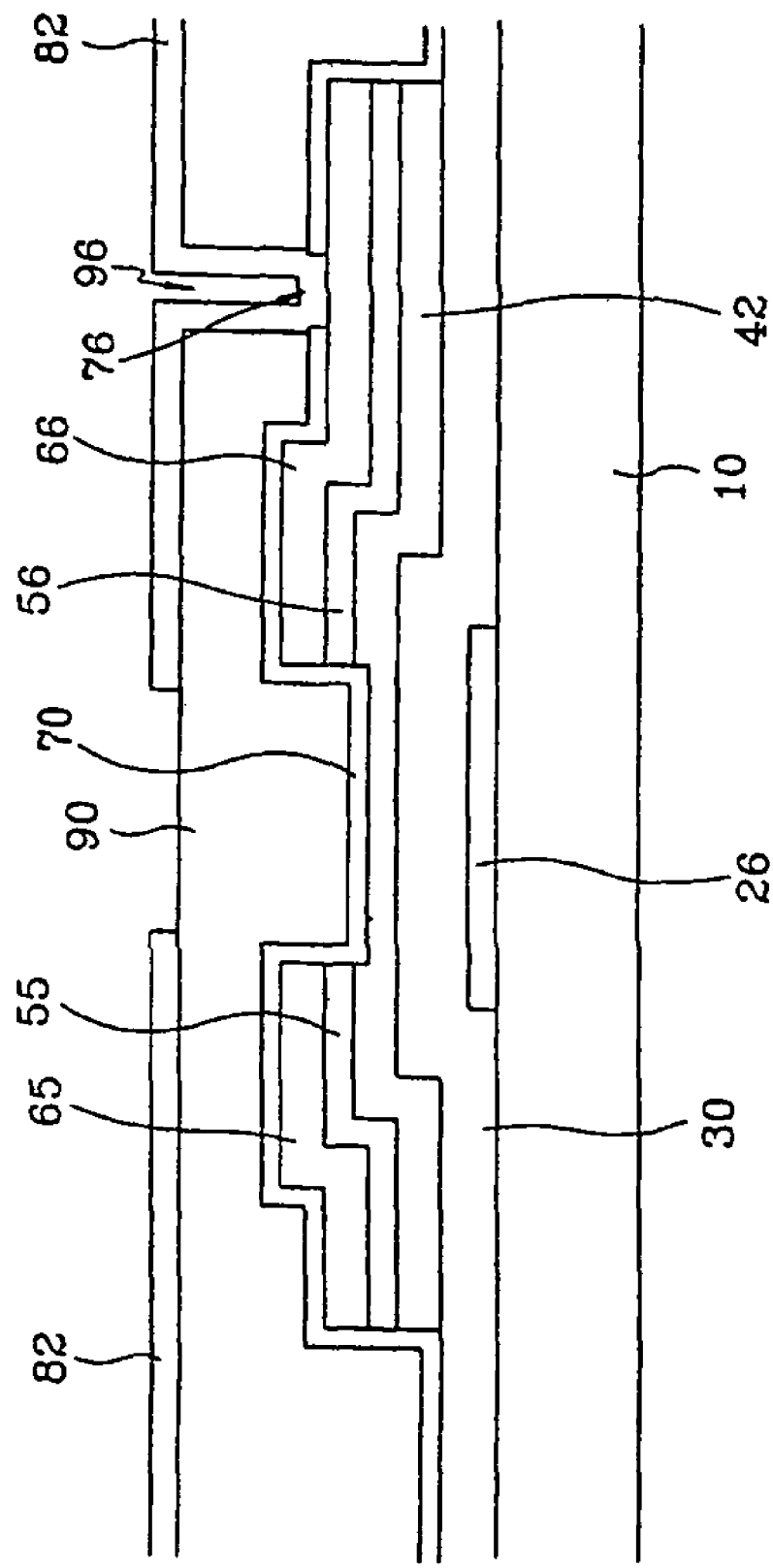

FIG. 14 is a layout view of an exemplary TFT array panel for a transmissive LCD according to another embodiment of the present invention, and FIGS. 15 and 16 are sectional views of the TFT array panel shown in FIG. 14 taken along the line XV-XV' and the line XVI-XVI', respectively.

Different from the TFT array panel shown in FIGS. 12 and 13, the TFT array panel according to this embodiment includes a plurality of storage electrodes lines 28 formed on an insulating substrate 10 but includes no expansion of a gate line 22. The storage electrode lines 28 are made of the same material as the gate lines 22, substantially parallel to the gate lines 22, and electrically separated from the gate lines 22. The storage electrode lines 28 are applied with a predetermined voltage such as a reference voltage and located opposite a plurality of storage conductors 64, which are connected to a plurality of transparent electrodes 82, with respect to a gate insulating layer 30 to form a plurality of storage capacitors. The storage electrode lines 28 may be omitted if the storage capacitance due to the overlapping of the gate lines 22 and the transparent electrodes 82 are sufficient.

In addition, as well as a plurality of semiconductor stripes 42 and a plurality of ohmic contacts 55 and 56, a plurality of semiconductor islands 48 and a plurality of ohmic contacts 58 thereover are provided under the storage conductors 64.

The semiconductor stripes 42 have almost the same planar shapes as a plurality of data lines 62 and a plurality of drain electrodes 66 except for channel areas C of TFTs. For example, although the data lines 62 are disconnected from the drain electrodes 66 on the channel areas C, the semiconductor stripes 42 are continuous on the channel areas C to form channels of the TFTs. The semiconductor islands 48 have substantially the same planar shapes as the storage conductors 64. The ohmic contacts 55, 56 and 58 have substantially the same planar shapes as the data lines 62, the drain electrodes 66 and the storage conductors 64 thereover.

Now, a method of manufacturing a TFT array panel for a transmissive LCD according to another embodiment of the present invention will be described in detail with reference to FIGS. 17A-24 C as well as FIGS. 14-16.

FIGS. 17A, 19A, 23A and 24A are layout views of a TFT array panel for a transmissive type LCD in the respective steps of a manufacturing method thereof according to another embodiment of the present invention. FIGS. 17B and 18A and FIGS. 17C and 18B are sectional views of the TFT array panel shown in FIG. 17A taken along the lines XVIIB-XVIIB' and XVIIC-XVIIC', respectively, and sequentially illustrate a manufacturing method thereof according to another embodiment of the present invention. FIGS. 19B, 20A, 21A and 22A and FIGS. 19C, 20B, 21B and 22B are sectional views of the TFT array panel shown in FIG. 19A taken along the lines XIXB-XIXB' and XIXC-XIXC', respectively, and sequentially illustrate a manufacturing method thereof according to another embodiment of the present invention. FIGS. 23B and 23C are sectional views of the TFT array panel shown in FIG. 23A taken along the lines XXIIIB-XXIIIB' and XXIIIC-XXIIIC', respectively, and FIGS. 24B and 24C are sectional views of the TFT array panel shown in FIG. 24A taken along the lines XXIVB-XXIVB' and XXIVC-XXIVC', respectively.

Figure 17A:
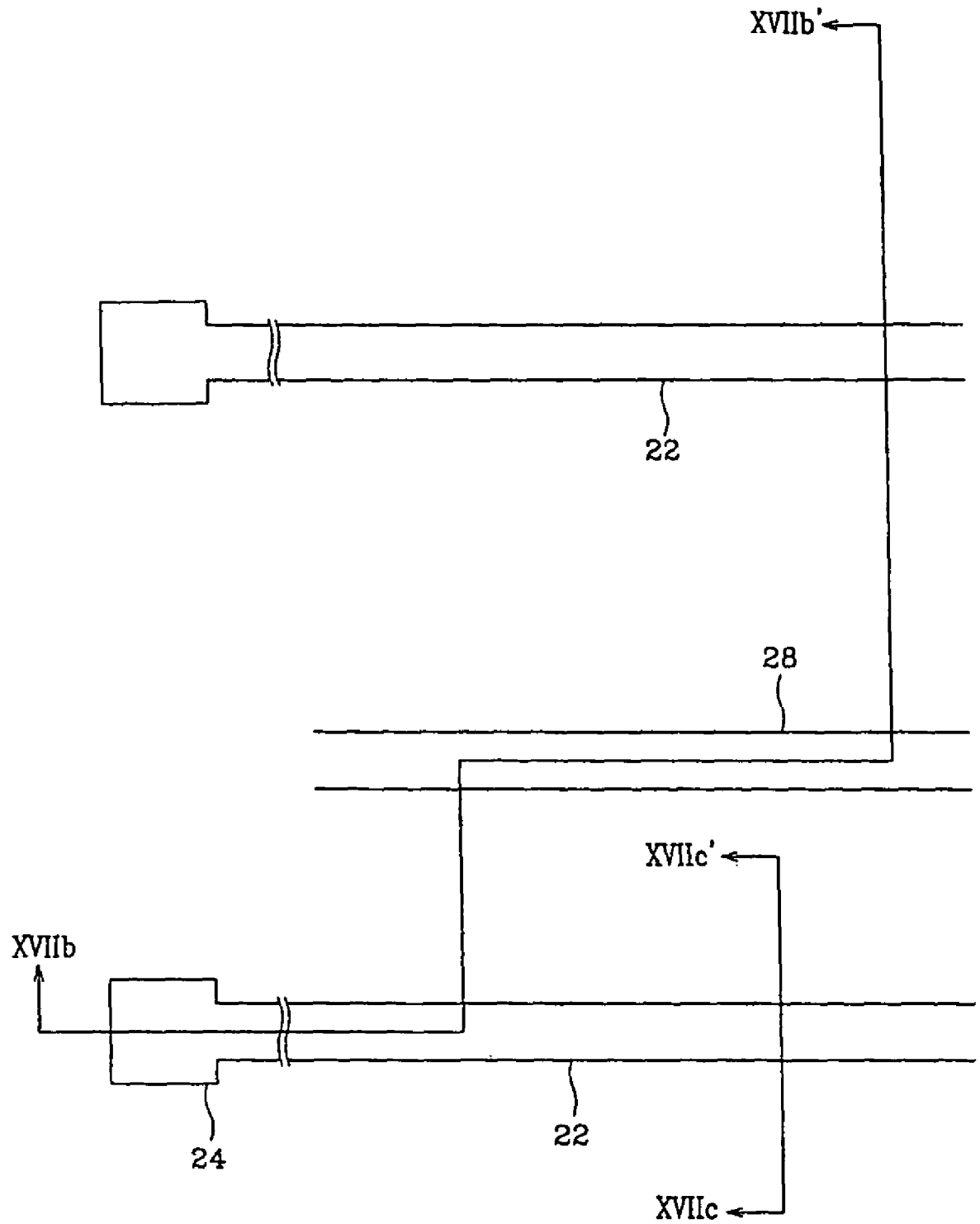
FIG. 17A is a layout view of a TFT array panel in the first step of a manufacturing method thereof according to an embodiment of the present invention.
Figure 17B:
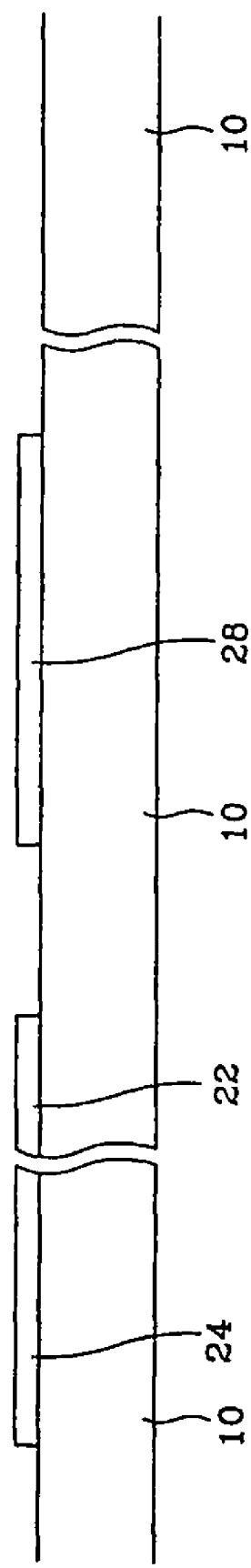
FIGS. 17B and 17C are sectional views of the TFT array panel shown in FIG. 17A taken along the lines XVIIB-XVIIB' and XVIIC-XVIIC', respectively.
Figure 17C:
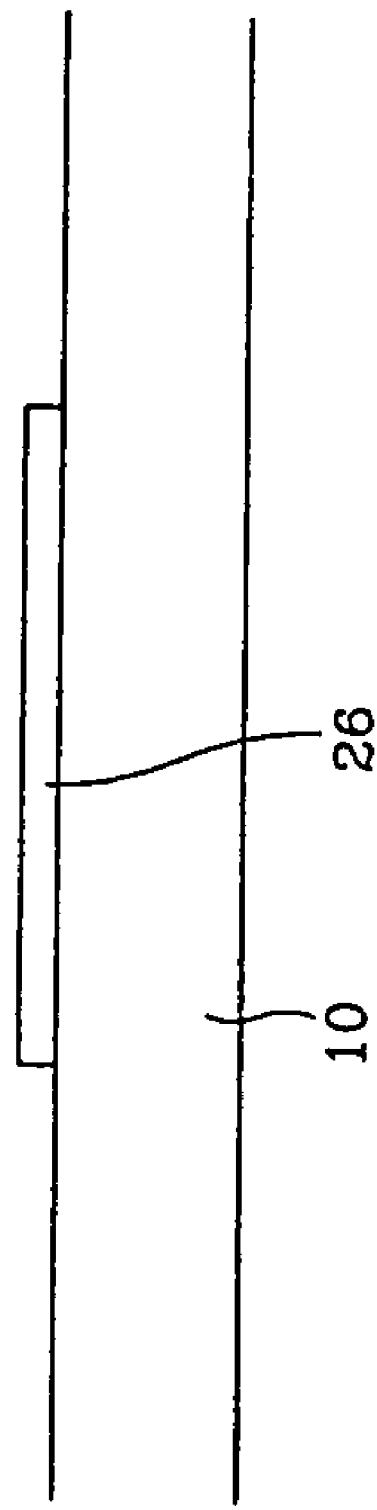

As shown in FIGS. 17A-17C, a conductive layer is deposited on a substrate 10 and patterned by photolithography and etched to form a plurality of gate lines 22 and a plurality of storage electrode lines 28.

Figure 18A:
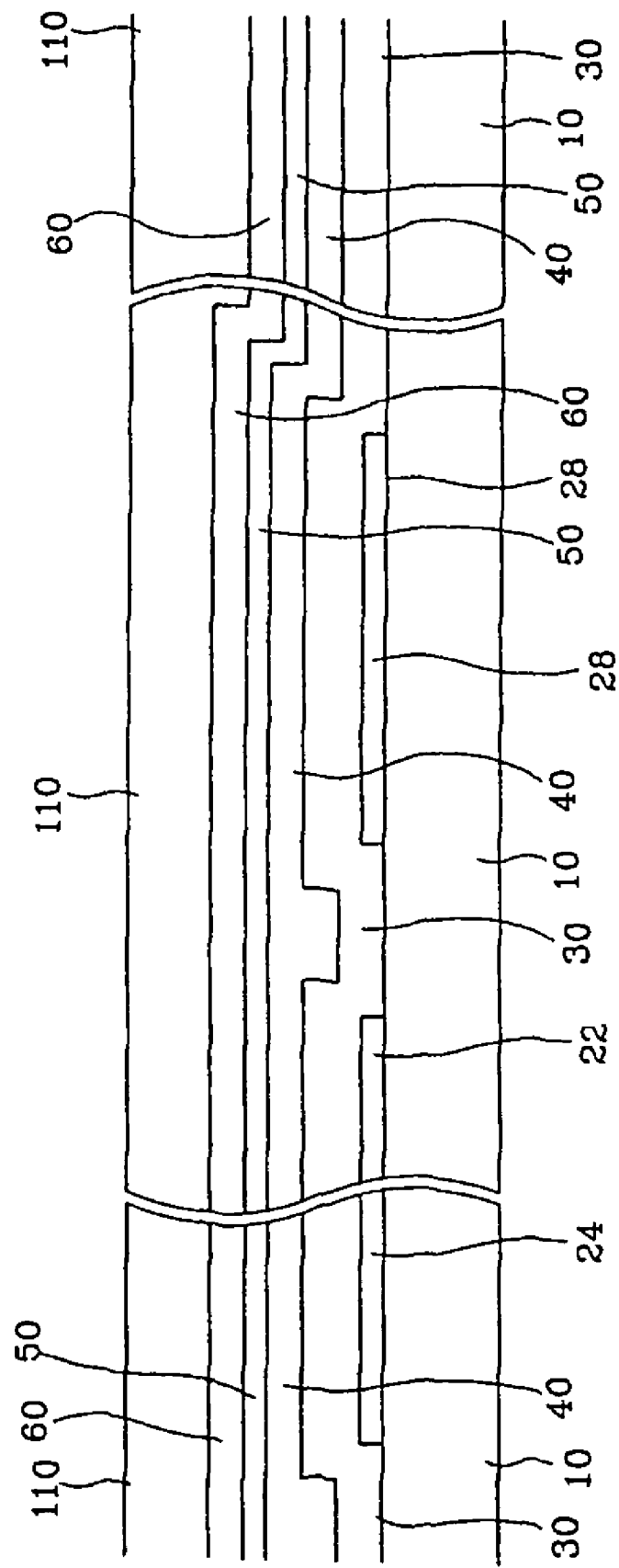

Next, as shown in FIGS. 18A and 18B, a gate insulating layer 30, a semiconductor layer 40, and a doped amorphous silicon layer 50 are sequentially deposited by CVD such that the layers 30, 40, and 50 bear thickness of about 1,500-5,000 Å, about 500-2,000 Å, and about 300-600 Å, respectively. A conductive layer 60 with the thickness of about 1,500-3,000 Å is deposited by sputtering, and a photoresist film 110 with the thickness of about 1-2 microns is coated on the conductive layer 60.

Figure 19A:
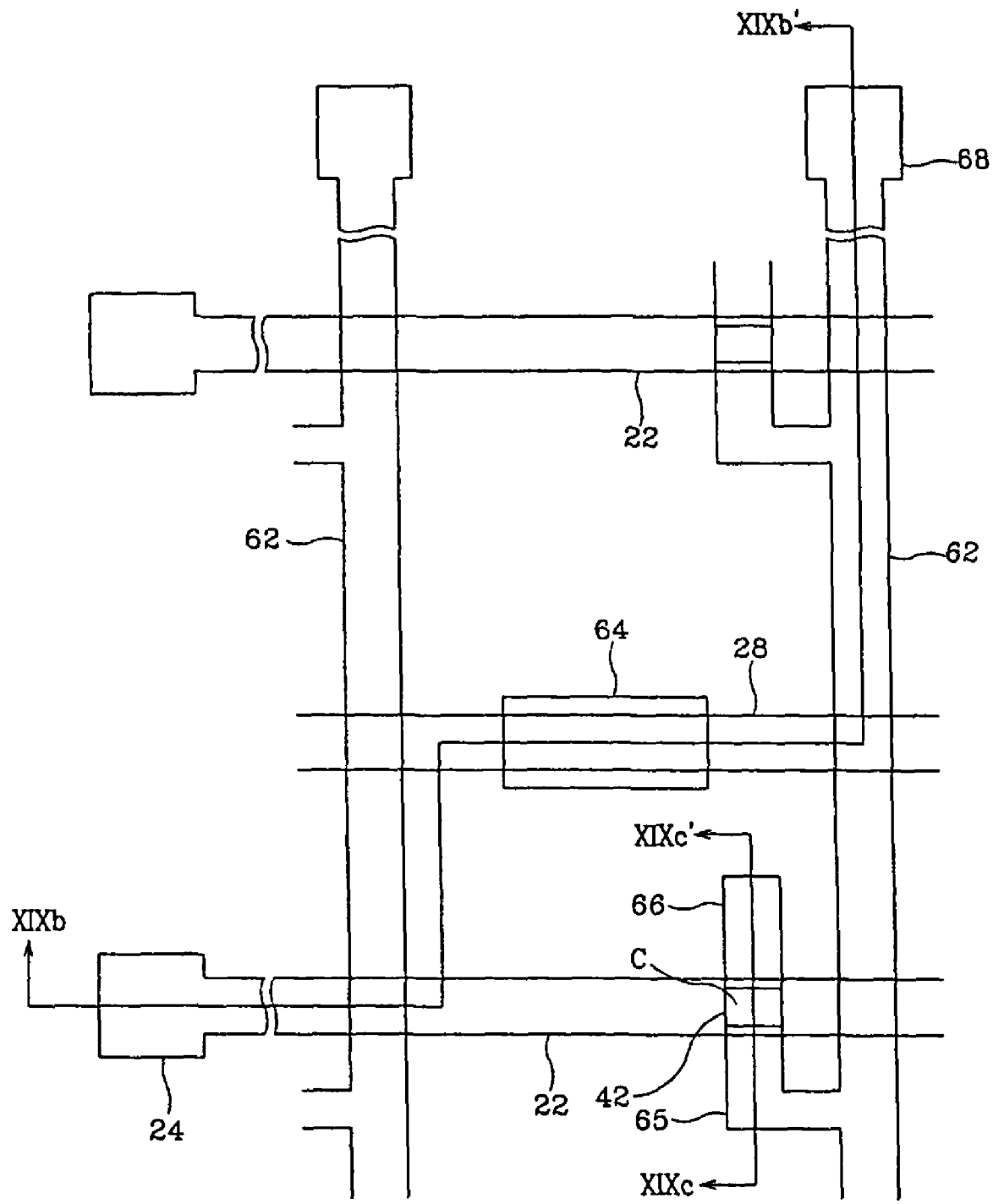
FIG. 19A is a layout view of a TFT array panel in the step following the step shown in FIGS. 18A and 18B.
Figure 19B:
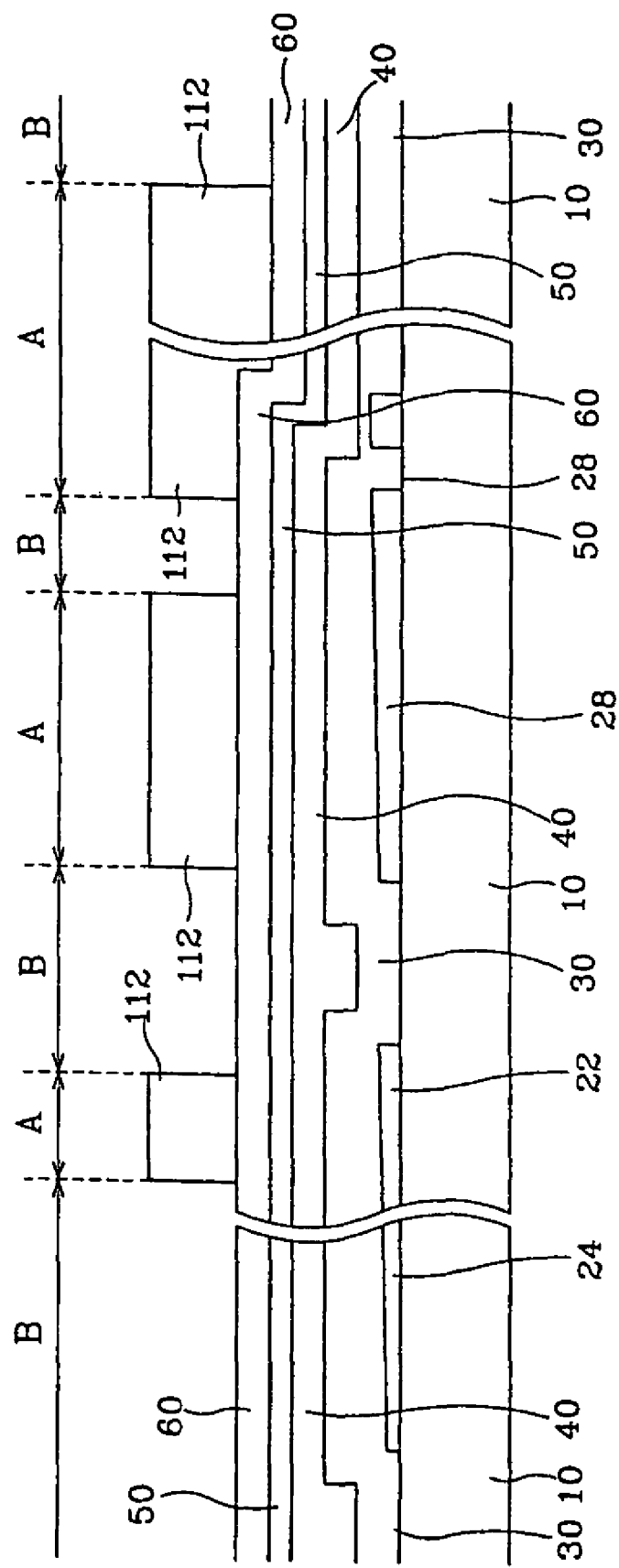
FIGS. 19B and 19C are sectional views of the TFT array panel shown in FIG. 19A taken along the lines XIXB-XIXB' and XIXC-XIXC', respectively.
Figure 19C:
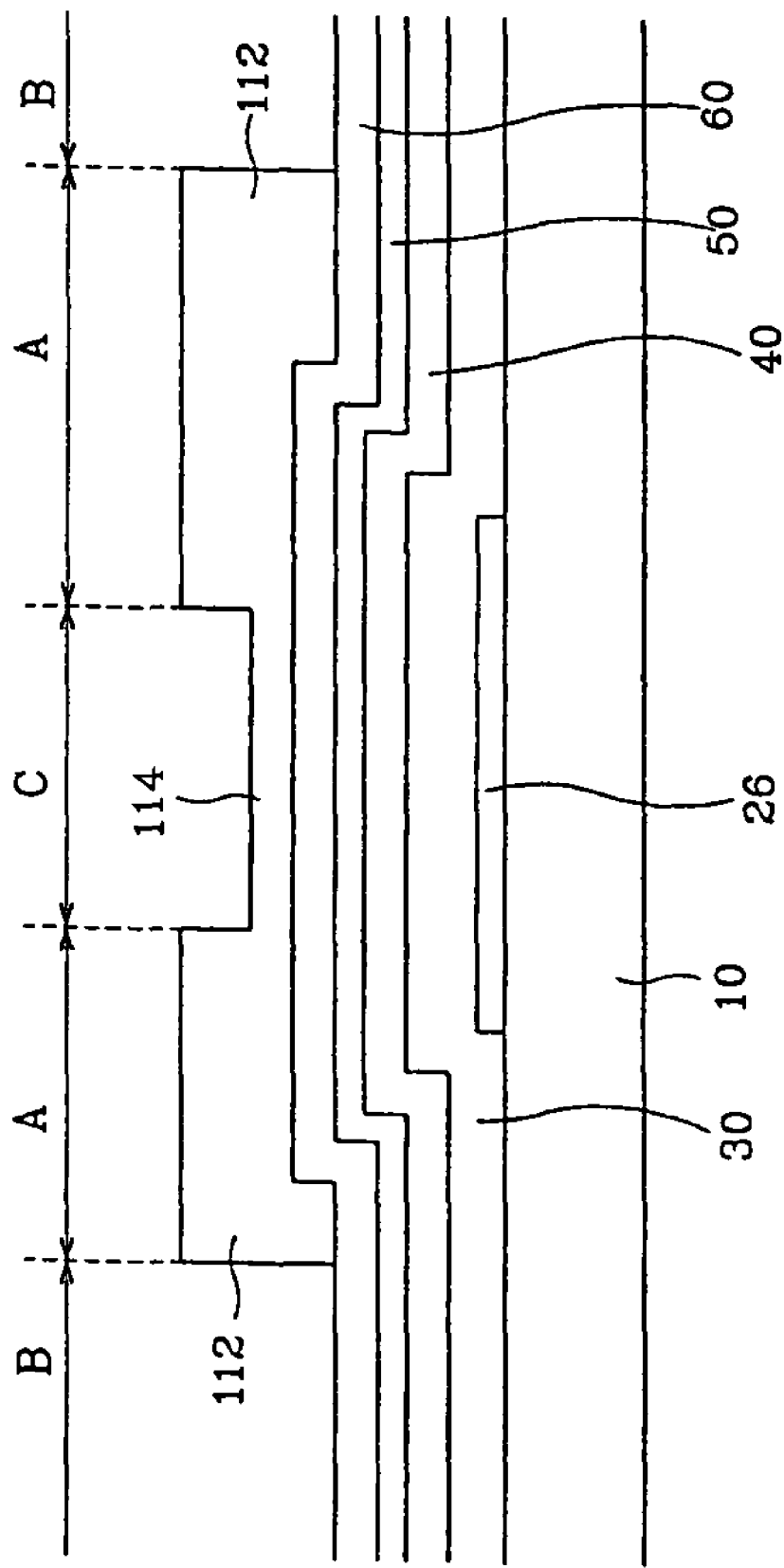

Subsequently, the photoresist film 110 is exposed to light through an exposure mask, and developed to form a photoresist pattern including a plurality of first and second portions 112 and 114 having different thickness as shown in FIGS. 19A-19C. Each of the second portions 114, which is placed on a channel area C of a TFT, is established to bear thickness smaller than the thickness of the first portions 112 placed on data areas A. The portions of the photoresist film 110 on the remaining areas B are removed or have a very small thickness. The thickness ratio of the second portions 114 on the channel areas C to the first portions 112 on the data areas A is adjusted depending upon the etching conditions in the subsequent etching steps. It is preferable that the thickness of the second portions 114 is equal to or less than half of the thickness of the first portions 112, in particular, equal to or less than 4,000 Å.

The position-dependent thickness of the photoresist film is obtained by several techniques, for example, by providing semi-transparent areas on the exposure mask as well as transparent areas and opaque areas. The semi-transparent areas alternatively have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use a reflowable photoresist. That is, once a photoresist pattern made of a reflowable material is formed by using a normal exposure mask only with transparent areas and opaque areas, it is subject to reflow process to flow onto areas without the photoresist, thereby forming thin portions.

Figure 20A:
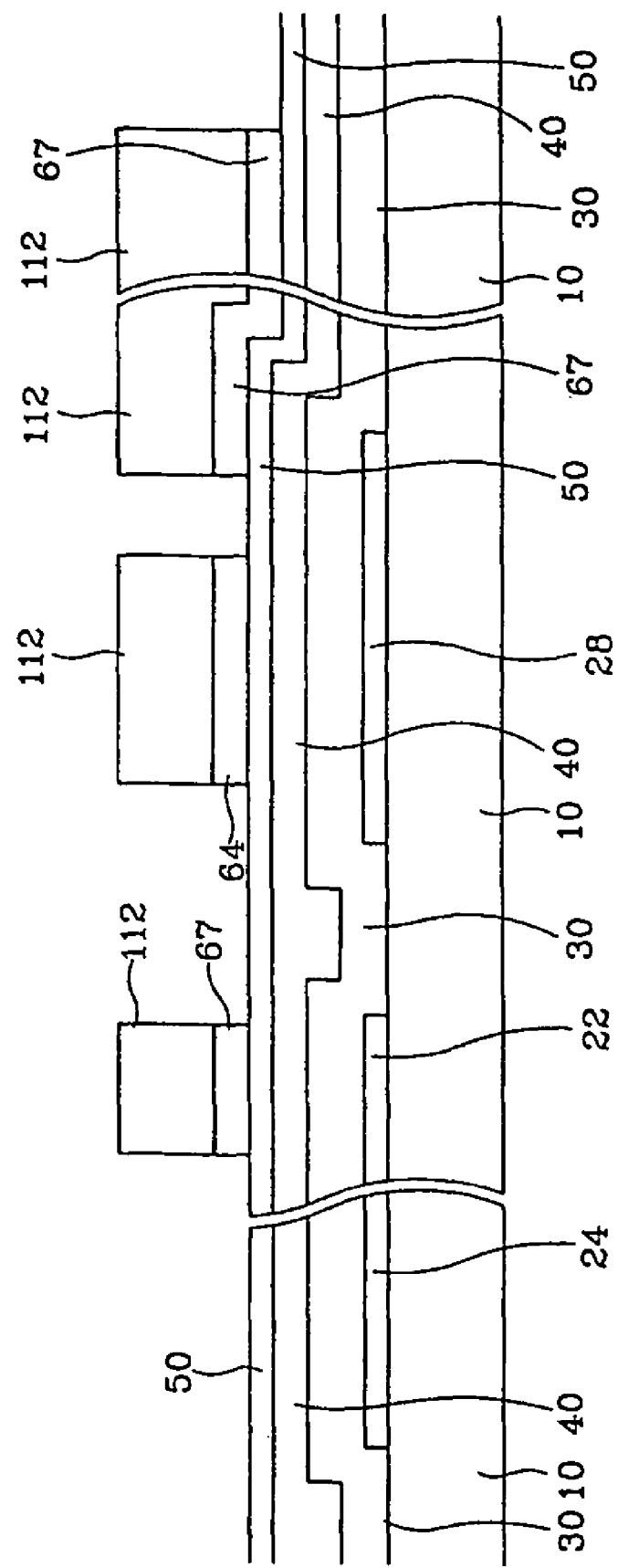

As shown in FIGS. 20A and 20B, exposed portions of a conductive layer 60 on the areas B are removed to expose the underlying portions of a doped amorphous silicon layer 50. Both dry etching and wet etching are applicable to the conductive layer 60 containing Al or Al alloy. Wet etching, preferably with an etchant CeNHO$_3$, is preferred for Cr. When using dry etching, the two portions 112 and 114 of the photoresist pattern may be etched to have a reduced thickness. Reference numerals 64 and 67 indicate the remaining portions of the conductive layer 60, which will be referred to as "conductors." In particular, the reference numeral 64 is referred to as "storage conductors."

Figure 21A:
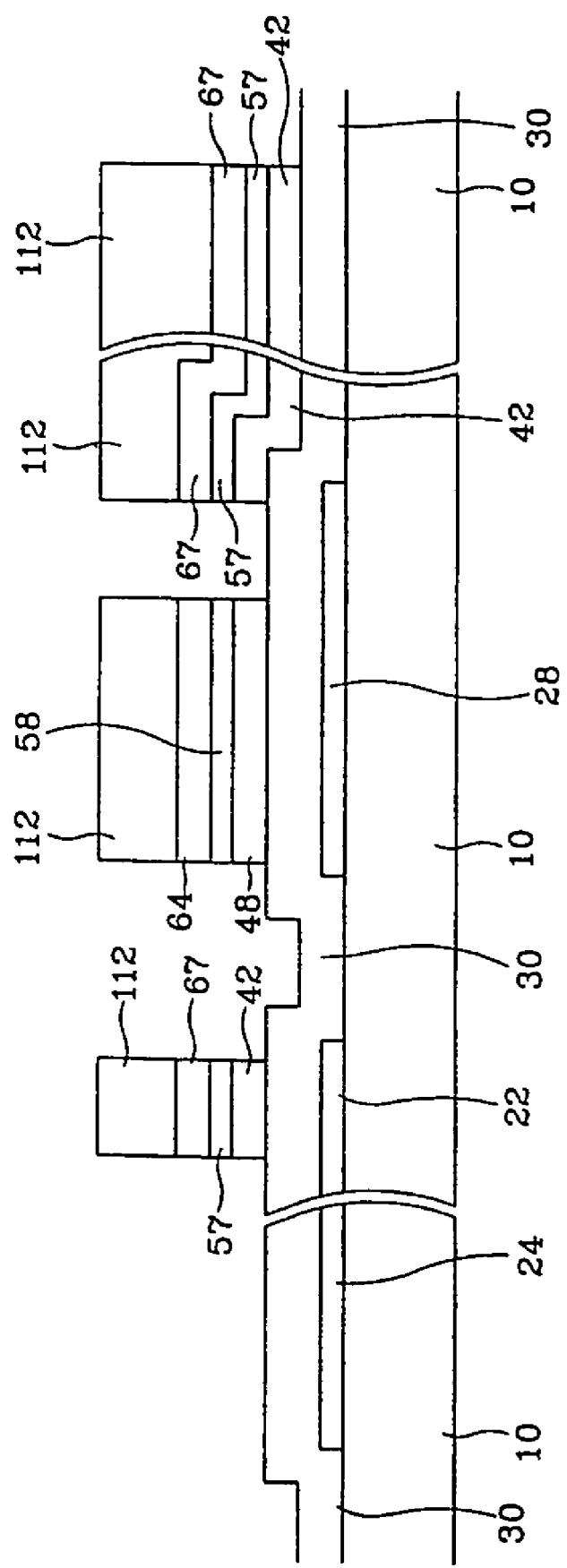
Figure 21B:
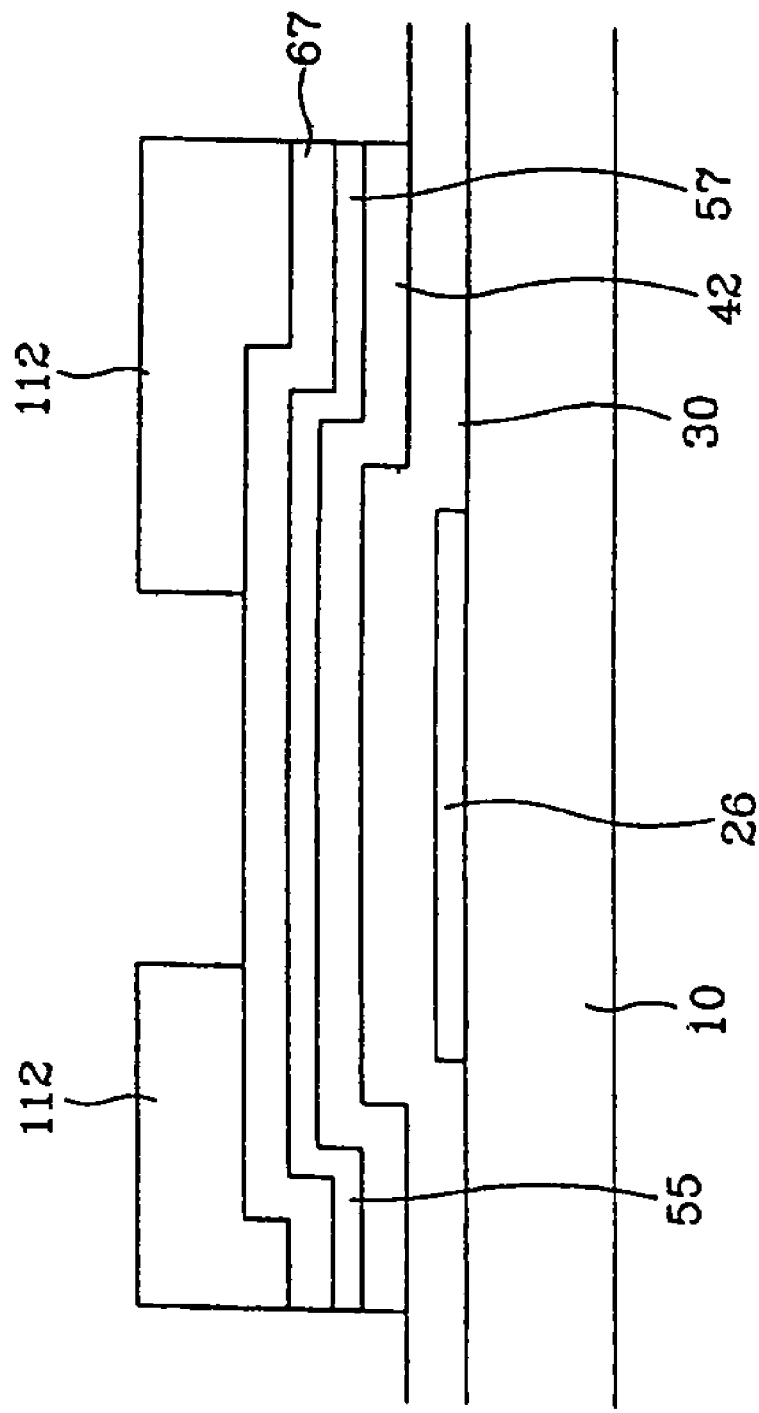

Referring to FIGS. 21A and 21B, exposed portions of a doped amorphous silicon layer 50 on the areas B and the underlying portions of a semiconductor layer 40 are removed preferably by dry etching to expose the underlying conductors 67. The second portions 114 of the photoresist pattern are removed either simultaneously with or independent from the removal of the doped amorphous silicon layer 50 and the semiconductor layer 40. Residue of the second portions 114 remained on the channel area C is removed by ashing. Reference numerals 42 and 48 indicate the remaining portions of the semiconductor layer 40, which will be respectively referred to as "semiconductor stripes" and "semiconductor islands" based on their planar shapes. Reference numerals 57 and 58 indicate the remaining portions of the doped amorphous silicon layer 50, which will be respectively referred to as "doped amorphous silicon stripes" and "doped amorphous silicon islands" based on their planar shapes.

Figure 22A:
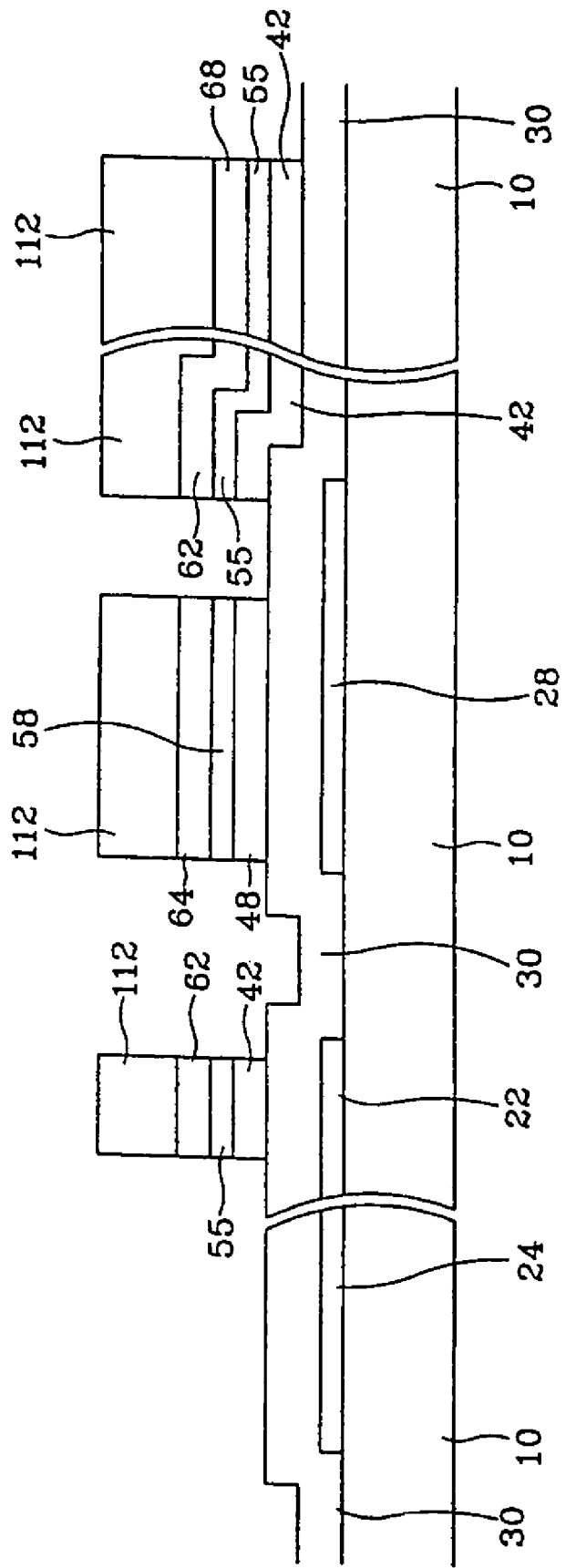

Subsequently, as shown in FIGS. 22A and 22B, the exposed portions of conductors 67 on the channel areas C and the underlying portions of doped amorphous silicon stripes 57 are removed. As shown in FIG. 22B, top portions of semiconductor stripes 42 on the channel areas C may be removed to cause thickness reduction, and the first portion 112 of the photoresist pattern is etched to a predetermined thickness.

In this way, each conductor 67 on the channel area is divided into a data line 62 and a plurality of drain electrodes 66 to be completed, and also each doped amorphous silicon stripe 57 is divided into an ohmic contact stripe 55 and a plurality of ohmic contact islands 56 to be completed.

The first portions 112 remained on the data areas A are removed either after the removal of the portions of the conductors 67 on the channel areas C or after the removal of the underlying portions of the doped amorphous silicon stripes 57.

Figure 23A:
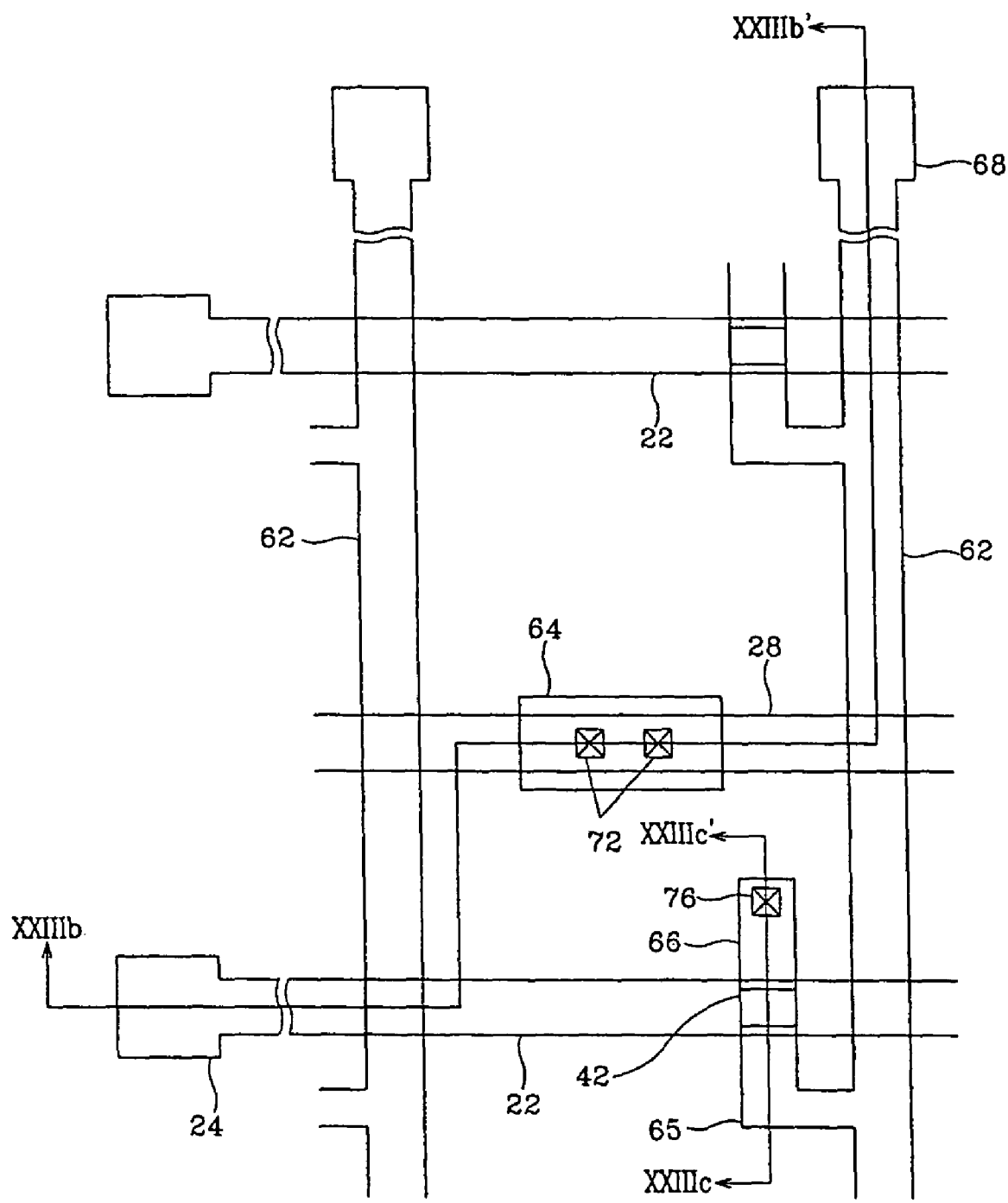
FIG. 23A is a layout view of a TFT array panel in steps following the steps shown in FIGS. 22A and 22B.
Figure 23B:
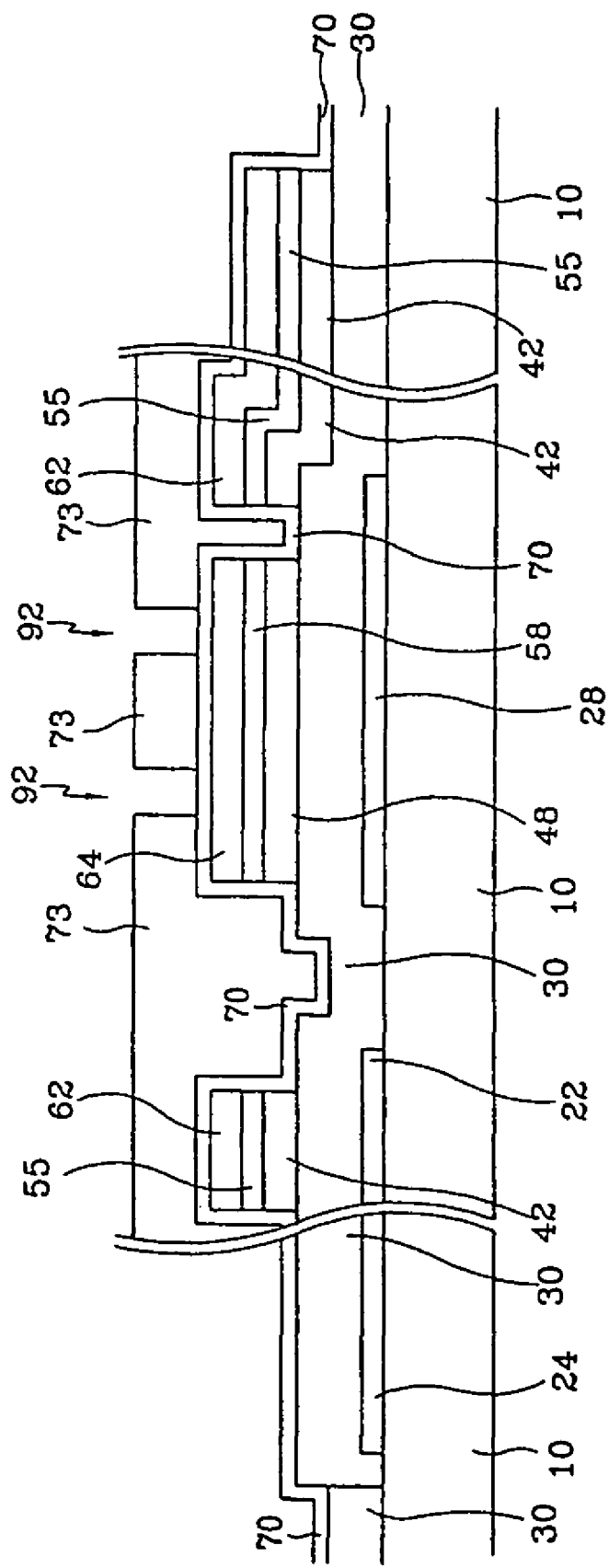
FIGS. 23B and 23C are sectional views of a TFT array panel shown in FIG. 23A taken along the lines XXIIIB-XXIIIB' and XXIIIC-XXIIIC', respectively.
Figure 23C:
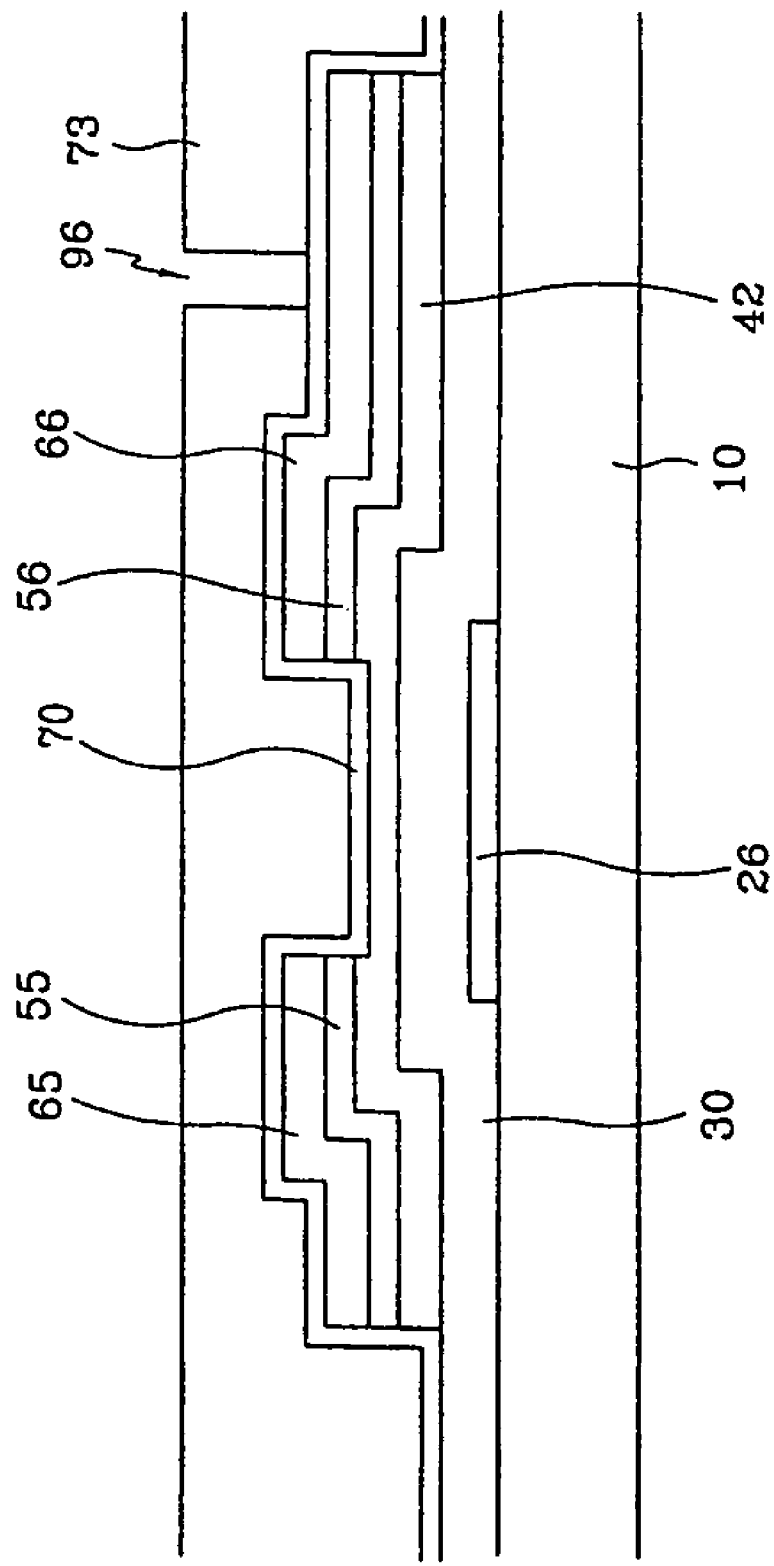

After forming the data lines 62, the drain electrodes and the storage conductors 64 as described above, a lower insulating layer 70 is deposited by CVD, and an upper insulating layer 90 is spin-coated on the lower insulating layer 70 as shown in FIGS. 23A and 23B. The upper insulating layer 90 is then patterned by photolithography such that a plurality of contact holes 96 and 92 on the drain electrodes 66 and the storage conductors 64 are formed and portions of the upper insulating layer 90 on the pad areas are removed.

Figure 24A:
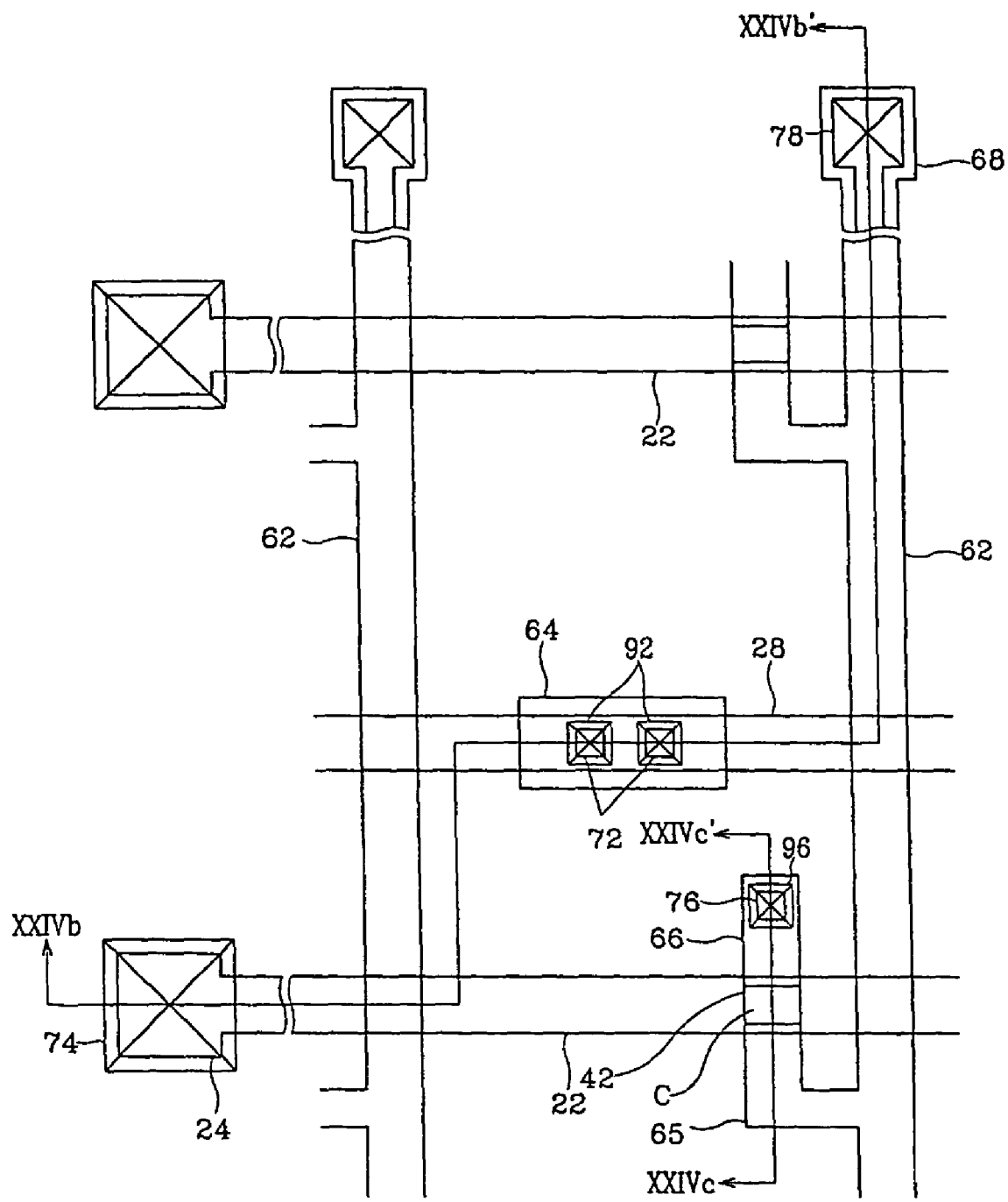
FIG. 24A is a layout view of a TFT array panel in steps following the steps shown in FIGS. 23B and 23C.
Figure 24B:
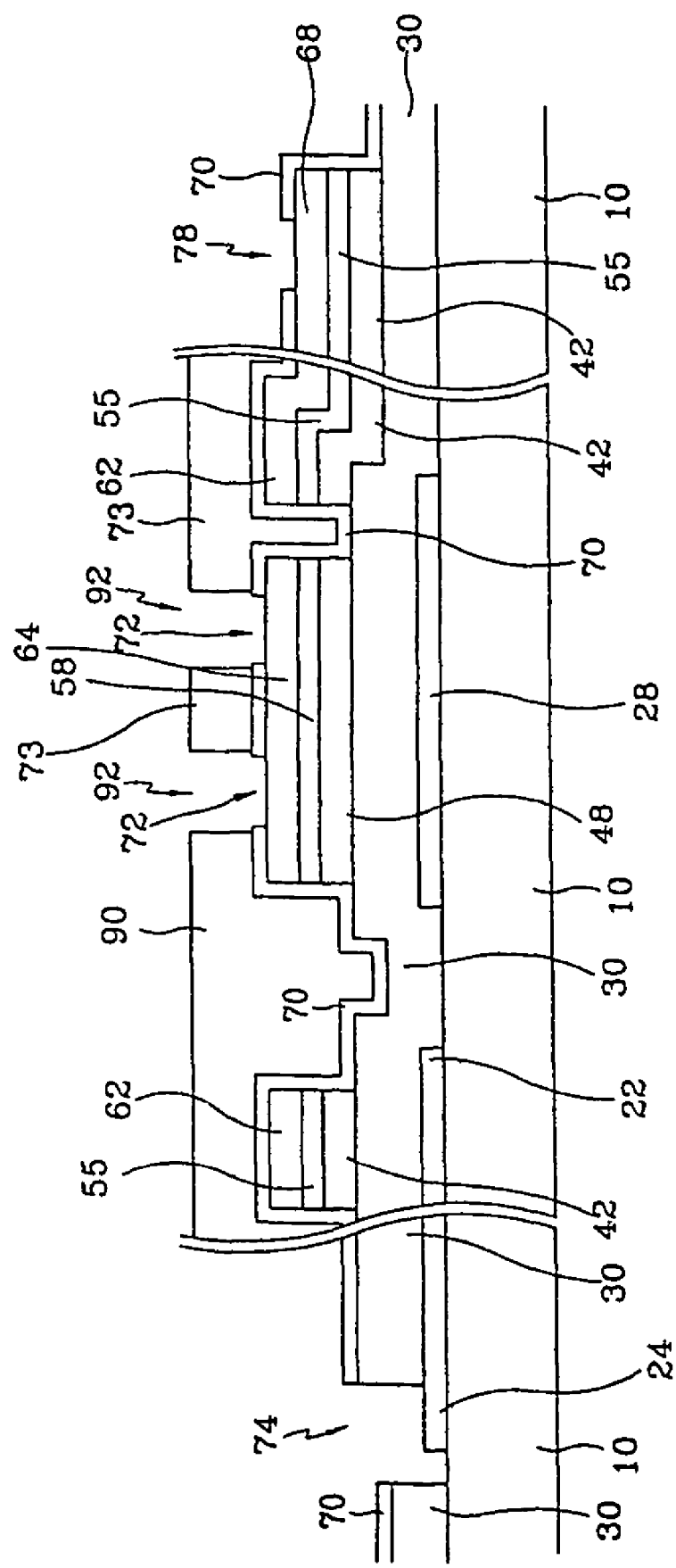
FIGS. 24B and 24C are sectional views of the TFT array panel shown in FIG. 24A taken along the lines XXIVB- XXIVB' and XXIVC-XXIVC' and illustrate the sequence of steps following the steps shown in FIGS. 23B and 23C, respectively.
Figure 24C:
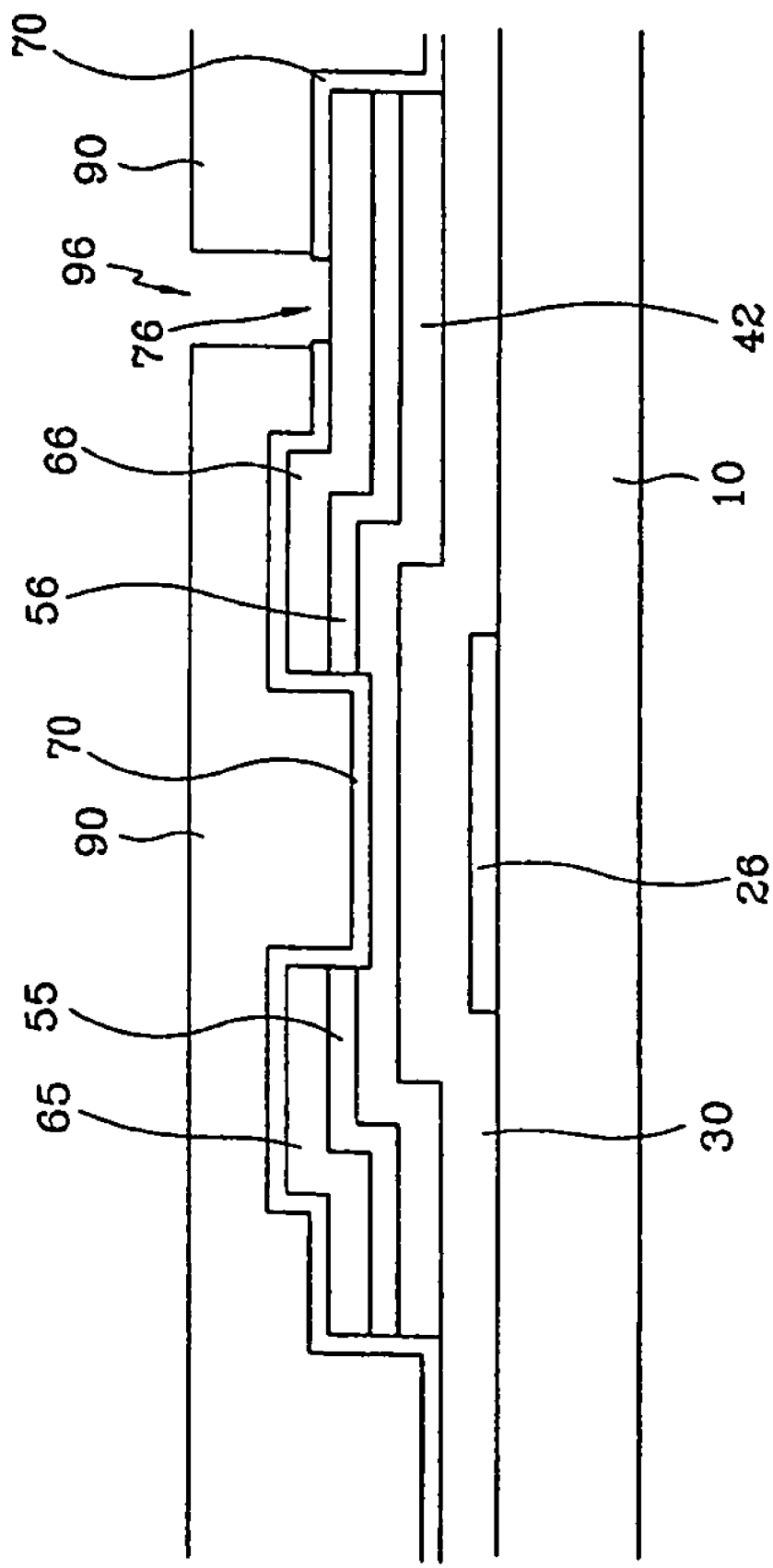
Figure 25:
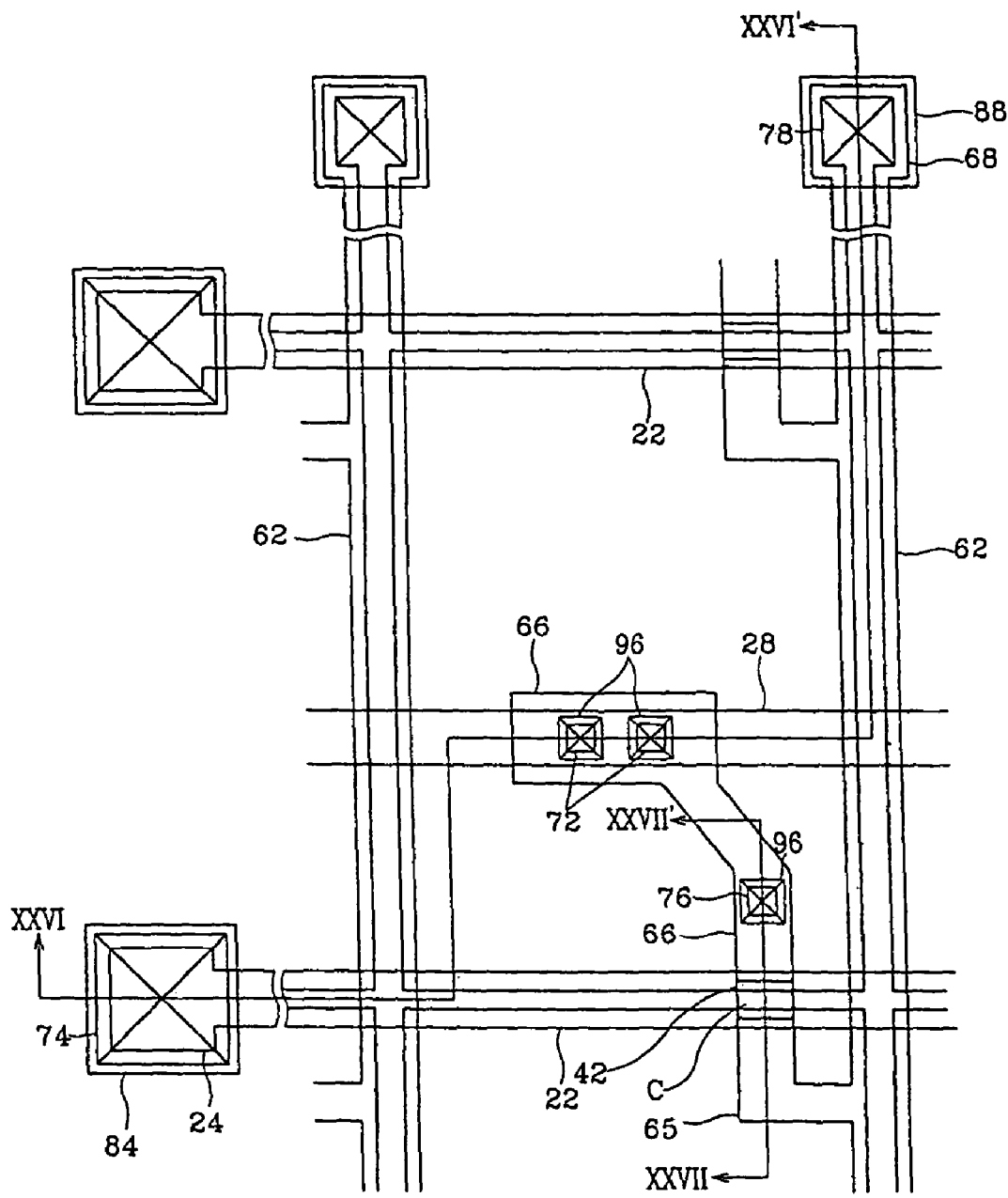
FIG. 25 is a layout view of an exemplary TFT array panel for a transmissive LCD according to another embodiment of the present invention.
Figure 26:
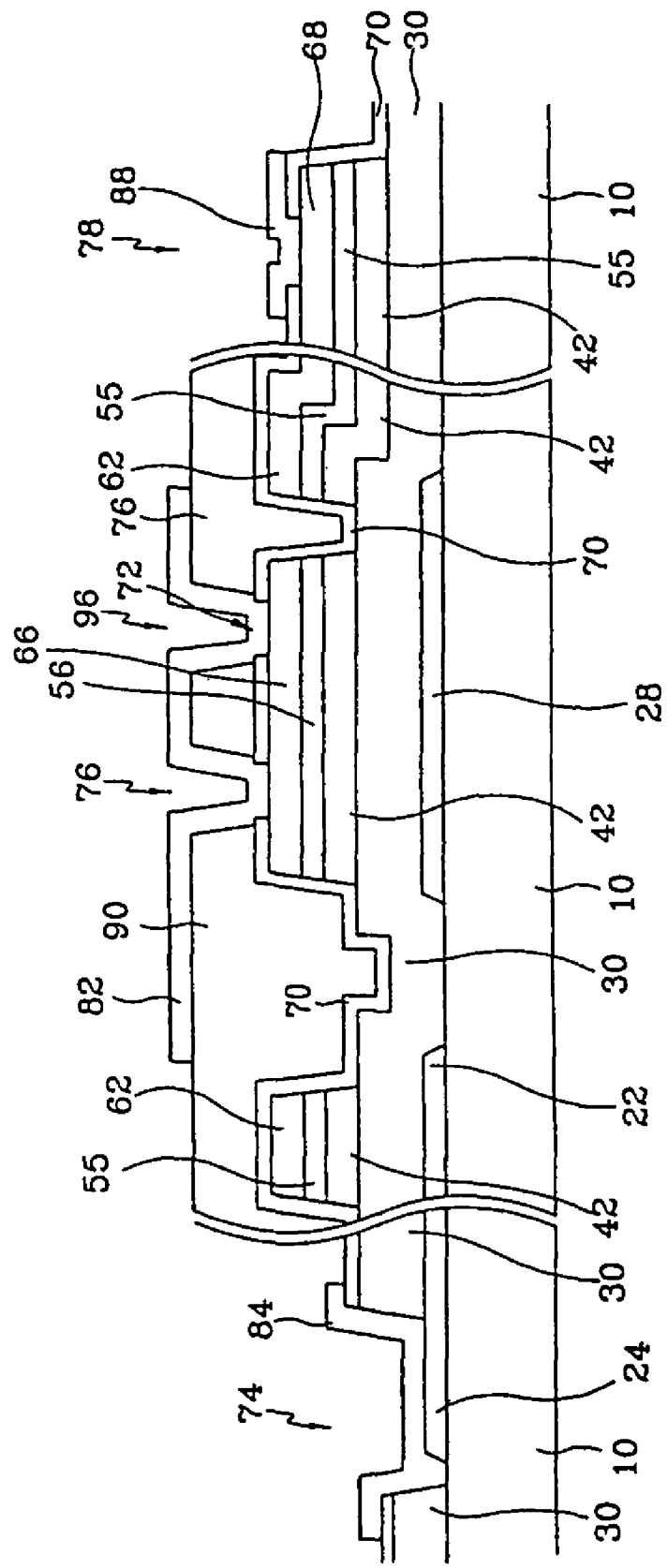
FIGS. 26 and 27 are sectional views of the TFT array panel shown in FIG. 25 taken along the line XXVI-XXVI' and the line XXVII-XXVII', respectively.
Figure 27:
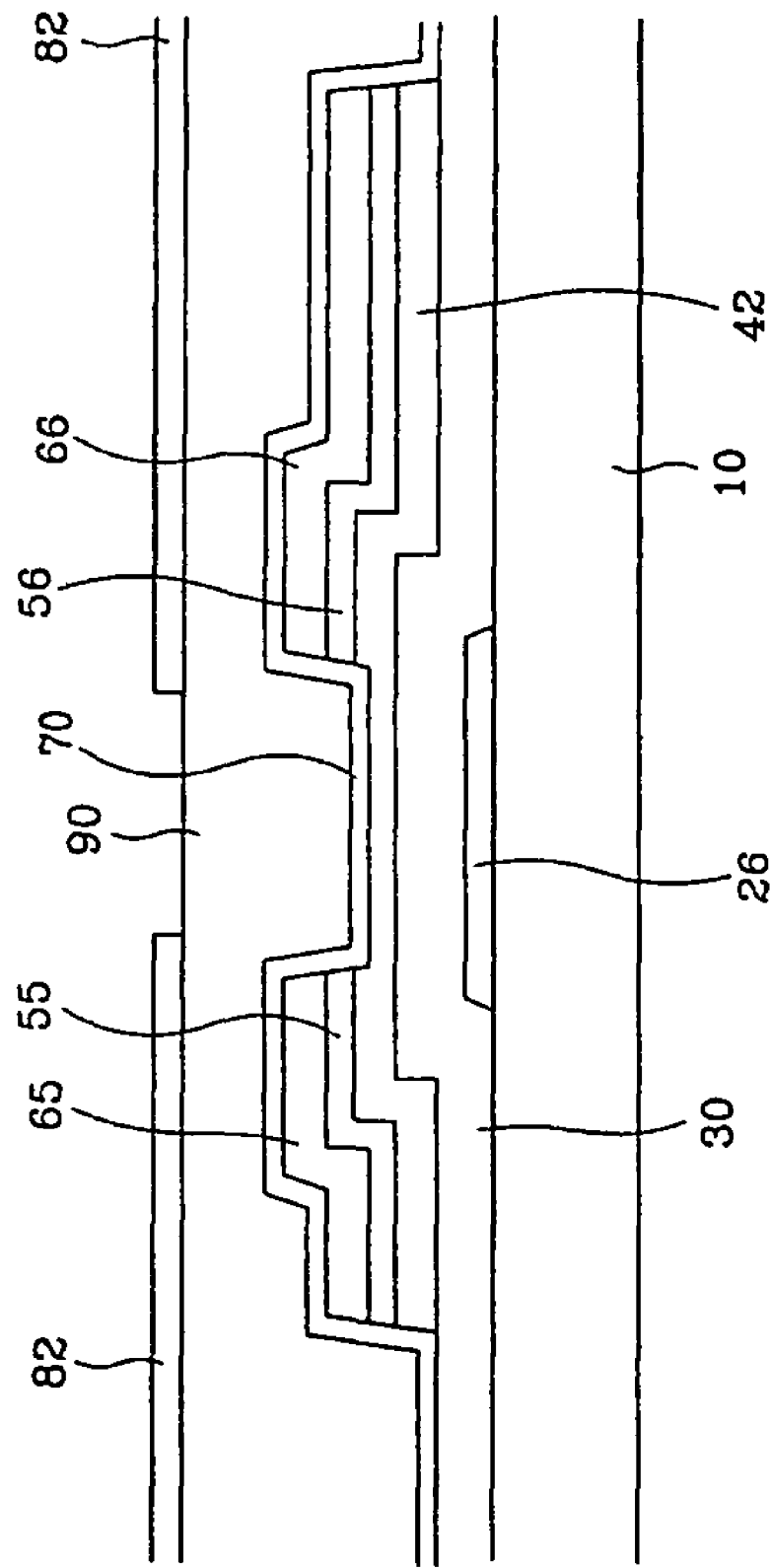

Referring to FIGS. 24A and 24B, a lower insulating layer 70 as well as a gate insulating layer 30 is patterned by using a photoresist pattern or the upper insulating layer 90 as an etch mask to form a plurality of contact holes 74, 76, 72 and 78 exposing end portions of gate lines 22, drain electrodes 66, storage conductors 64, and end portions of data lines 62.

Then, as shown in FIGS. 14 to 16, a plurality of pixel electrodes 82 and a plurality of contact assistants 84 and 88 with a thickness of about 400-500 Å are formed.

This embodiment of the present invention provides a simplified process that the data lines 62 and the drain electrodes 64, the ohmic contacts 55, 56 and 58 and the semiconductor stripes and islands 42 and 48 thereunder are formed using one photomask, and simultaneously, the source and the drain electrodes 65 and 66 are separated from each other in this step.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a semiconductor device, the method comprising:
   forming a first conductor on a substrate;
   depositing a first insulating layer on the first conductor;
   forming a second insulating layer on the first insulating layer, the second insulating layer having a first contact hole opposite the first conductor;

patterning the first insulating layer by using either a photoresist pattern or the second insulating layer as an etch mask to form a second contact hole exposing the first conductor together with the first contact hole;

forming a second conductor connected to the first conductor through the first and the second contact holes; and narrowing the second contact hole after patterning the first insulating layer and before forming the second conductor, wherein the first contact hole and the second contact hole form a step structure exposing a top surface of the first insulating layer, wherein narrowing the second contact hole comprises reflowing the second insulating layer.

2. The method of claim 1, wherein the second insulating layer comprises organic insulating material.

3. The method of claim 2, wherein the formation of the second insulating layer comprises:

spin-coating the second insulating layer; and patterning the second insulating layer to form the first contact hole.

4. The method of claim 2, wherein the first insulating layer comprises silicon nitride or silicon oxide.

5. The method of claim 1, wherein the second conductor comprises at least one of reflective material and transparent material.

6. The method of claim 1, wherein a structure of the first and the second contact holes has a height-dependent width.

7. A method of manufacturing a thin film transistor array panel for a liquid crystal display, the method comprising:

forming a gate line on an insulating substrate;

depositing a gate insulating layer;

forming a semiconductor layer;

forming a data line intersecting the gate line and a drain electrode disconnected from the data line;

depositing a first insulating layer;

forming a second insulating layer which has a surface with an uneven pattern;

patterning the second insulating layer to form a first contact hole on the drain electrode;

patterning the first insulating layer using a photoresist pattern or the second insulating layer to form a second contact hole exposing a portion of the drain electrode together with the first contact hole;

forming a pixel electrode electrically connected to the drain electrode through the first and the second contact holes; and narrowing the second contact hole after patterning the first insulating layer, wherein the first contact hole and the second contact hole form a step structure exposing a top surface of the first insulating layer, wherein narrowing the second contact hole comprises reflowing the second insulating layer.

8. The method of claim 7, wherein the second insulating layer comprises organic insulating material.

9. The method of claim 8, wherein the formation of the second insulating layer comprises:

spin-coating the second insulating layer; and patterning the second insulating layer to form the first contact hole.

10. The method of claim 7, wherein a structure of the first and the second contact holes has a height-dependent width.

11. The method of claim 7, wherein the first insulating layer Comprises silicon nitride or silicon oxide.

12. The method of claim 7, wherein the pixel electrode comprises at least one of a reflecting electrode and a transparent electrode.

13. The method of claim 7, wherein the pixel electrode has a reflecting electrode.

14. The method of claim 7, wherein the data line, the drain electrode and the semiconductor layer are formed in one single etching procedure.

15. A method of manufacturing a thin film transistor array panel for a liquid crystal display, the method comprising:

forming a gate line on an insulating substrate;

depositing a gate insulating layer;

forming a semiconductor layer;

forming a data line intersecting the gate line and a drain electrode disconnected from the data line;

depositing a first insulating layer;

forming a second insulating layer which has a surface with an uneven pattern;

patterning the second insulating layer to form a first contact hole by exposing the second insulating layer to light through a photomask comprising a transparent area, an opaque area and a translucent area; patterning the first insulating layer using the second insulating layer to form a second contact hole exposing a portion of the drain electrode together with the first contact hole; forming a pixel electrode electrically connected to the drain electrode through the first and the second contact holes;

forming a pixel electrode electrically connected to the drain electrode through the first and the second contact holes; and narrowing the second contact hole after the patterning of the first insulating layer, wherein the first contact hole and the second contact hole form a step structure exposing a top surface of the first insulating layer.

16. The method of claim 15, wherein the second insulating layer comprises organic insulating material.

17. The method of claim 16, wherein the formation of the second insulating layer comprises:

spin-coating the second insulating layer; and patterning the second insulating layer to form the first contact hole.

18. The method of claim 16, wherein the first insulating layer comprises silicon nitride or silicon oxide.

19. The method of claim 15, wherein the second conductor comprises at least one of reflective material and transparent material.

20. The method of claim 15, wherein a structure of the first and the second contact holes has a height-dependent width.

21. The method of claim 15, wherein the photomask comprises slit mask.

22. The method of claim 15, wherein the data line, the drain electrode and the semiconductor layer are formed in one single etching procedure.

* * * * *